US012804830B2

(12) United States Patent
Peng et al.

(10) Patent No.: US 12,804,830 B2
(45) Date of Patent: Nov. 17, 2026

(54) ROTATING SHAFT MECHANISM AND TERMINAL DEVICE

(71) Applicant: HUAWEI TECHNOLOGIES CO., LTD., Shenzhen (CN)

(72) Inventors: Lexiong Peng, Dongguan (CN); Yong Liu, Dongguan (CN); Ding Zhong, Dongguan (CN); Wenwen Wu, Dongguan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 476 days.

(21) Appl. No.: 18/472,399

(22) Filed: Sep. 22, 2023

(65) Prior Publication Data

US 2024/0015909 A1 Jan. 11, 2024

Related U.S. Application Data

(63) Continuation of application No. PCT/CN2022/081769, filed on Mar. 18, 2022.

(30) Foreign Application Priority Data

Mar. 24, 2021 (CN) ......................... 202110312420.3

(51) Int. Cl.
*G06F 1/16* (2006.01)
*F16C 11/04* (2006.01)
(Continued)

(52) U.S. Cl.
CPC ............ *H05K 5/0226* (2013.01); *F16C 11/04* (2013.01); *G06F 1/1641* (2013.01);
(Continued)

(58) Field of Classification Search
CPC ........ H05K 5/0226; F16C 11/04; F16C 11/12; G06F 1/1641; G06F 1/1681;
(Continued)

(56) References Cited

U.S. PATENT DOCUMENTS 10,070,546 B1 * 9/2018 Hsu ..................... E05D 11/1028
10,491,725 B1 11/2019 Harmon et al.
(Continued)

FOREIGN PATENT DOCUMENTS

CN 110442196 A 11/2019
CN 112769984 A 5/2021

OTHER PUBLICATIONS

Extended European Search Report dated Jul. 29, 2024, issued for European Application No. 22774154.3 (9 pages).

*Primary Examiner* — Rockshana D Chowdhury

(57) ABSTRACT

A rotating shaft mechanism includes a main shaft assembly and a damper assembly, and the damper assembly is rotatably connected to the main shaft assembly. The damper assembly may include a cam member and a rotating assembly, the cam member is fastened on the main shaft assembly, the cam member has a cam surface, the rotating assembly includes a rotating member and a sliding member, the rotating member is rotatably connected to the main shaft assembly, and the sliding member may slide in a direction toward or away from the main shaft assembly relative to the rotating member. The sliding member elastically abuts against the cam surface. An abutting force formed through elastic abutting may be transformed into resistance of relative rotation of the cam member and the rotating assembly, to generate a damping force between the main shaft assembly and the damper assembly.

20 Claims, 26 Drawing Sheets

(51) Int. Cl.

| | |
|---|---|
| ***H05K 5/00*** | (2025.01) |
| ***H05K 5/02*** | (2006.01) |
| *E05D 3/12* | (2006.01) |
| *H04M 1/02* | (2006.01) |

(52) U.S. Cl.
CPC .............. *G06F 1/1681* (2013.01); *E05D 3/12* (2013.01); *E05Y 2999/00* (2024.05); *H04M 1/0268* (2013.01)

(58) Field of Classification Search
CPC ....... G06F 1/1616; G06F 1/1652; E05D 3/12; E05Y 2999/00; H04M 1/0268; H04M 1/022; G09F 9/301
See application file for complete search history.

(56) References Cited

U.S. PATENT DOCUMENTS

| | | | | |
|---|---|---|---|---|
| 10,545,541 | B1 * | 1/2020 | Dighde | E05D 3/122 |
| 10,824,197 | B1 * | 11/2020 | Hsu | G06F 1/1641 |
| 10,845,850 | B1 * | 11/2020 | Kang | G06F 1/1681 |
| 11,016,541 | B2 * | 5/2021 | Lin | F16C 11/04 |
| 11,224,137 | B2 * | 1/2022 | Hsu | E05D 11/0081 |
| 11,605,796 | B2 * | 3/2023 | Kim | E05D 3/122 |
| 11,720,152 | B2 * | 8/2023 | Hsu | G06F 1/1681 16/354 |
| 11,720,153 | B2 * | 8/2023 | Hsu | G06F 1/1681 16/250 |
| 11,914,433 | B2 * | 2/2024 | Liao | H04M 1/0268 |
| 11,956,378 | B2 * | 4/2024 | Kang | H04M 1/022 |
| 11,983,047 | B2 * | 5/2024 | Park | G06F 1/1681 |
| 12,047,521 | B2 * | 7/2024 | Liao | H04M 1/0216 |
| 12,082,359 | B2 * | 9/2024 | Wang | G06F 1/1681 |
| 12,242,309 | B2 * | 3/2025 | Hyun | G06F 1/1647 |
| 12,267,446 | B2 * | 4/2025 | Kang | H04M 1/022 |
| 12,292,763 | B2 * | 5/2025 | Liu | G06F 1/1679 |
| 12,314,091 | B2 * | 5/2025 | Cheng | H04M 1/022 |
| 2018/0292860 | A1 * | 10/2018 | Siddiqui | H04M 1/0268 |
| 2019/0132975 | A1 * | 5/2019 | Kim | E05D 11/082 |
| 2019/0390703 | A1 * | 12/2019 | Hsu | E05D 11/082 |
| 2021/0034117 | A1 * | 2/2021 | Torres | E05D 3/06 |
| 2021/0263565 | A1 * | 8/2021 | Yen | G06F 1/1681 |
| 2022/0151092 | A1 * | 5/2022 | Cho | G06F 1/1652 |
| 2023/0384839 | A1 * | 11/2023 | Cheng | G06F 1/1681 |
| 2023/0403347 | A1 * | 12/2023 | Liu | G06F 1/1681 |
| 2024/0015909 | A1 * | 1/2024 | Peng | H05K 5/0226 |
| 2024/0069604 | A1 * | 2/2024 | Xu | G06F 1/1652 |
| 2024/0074075 | A1 * | 2/2024 | Kim | G06F 1/1616 |
| 2024/0090147 | A1 * | 3/2024 | Feng | H04M 1/022 |
| 2024/0094785 | A1 * | 3/2024 | Cheng | G06F 1/1681 |
| 2024/0147645 | A1 * | 5/2024 | Zhang | F16C 11/04 |
| 2024/0215182 | A1 * | 6/2024 | Zhang | G06F 1/1624 |
| 2024/0305704 | A1 * | 9/2024 | Zheng | B21J 5/002 |
| 2024/0410415 | A1 * | 12/2024 | Wang | F16C 11/04 |

* cited by examiner

ROTATING SHAFT MECHANISM AND TERMINAL DEVICE

CROSS-REFERENCE TO RELATED APPLICATIONS

This application is a continuation of International Application No. PCT/CN2022/081769, filed on Mar. 18, 2022, which claims priority to Chinese Patent Application No. 202110312420.3, filed on Mar. 24, 2021. The disclosures of the aforementioned applications are hereby incorporated by reference in their entireties.

TECHNICAL FIELD

This disclosure relates to the field of terminal device technologies, and in particular, to a rotating shaft mechanism and a terminal device.

BACKGROUND

As flexible foldable screen technologies are increasingly mature, a display manner of a terminal device changes greatly, and a foldable terminal product is definitely a future major development trend of a terminal product. The foldable terminal product (for example, an electronic device such as a foldable mobile phone, a foldable tablet computer, or a foldable computer) needs to have high reliability and good operation experience, so that the foldable terminal product can be easily accepted by a consumer.

The foldable mobile phone is used as an example. A flexible display of the foldable mobile phone may flexibly change based on different application scenarios, to switch a use mode. This is also a current research and development direction of a mobile phone manufacturer. However, the flexible display is only a part of a structure of the foldable mobile phone. A rotating shaft mechanism also needs to cooperate, so that an entire terminal product is foldable. In addition to changing a folding state of the foldable mobile phone, the rotating shaft mechanism may provide enough damping forces for the entire foldable mobile phone in different folding states, so that the foldable mobile phone has reliable support in a folding state switching process.

The foldable terminal product has reliable support, to effectively reduce a risk of damage to the flexible display. Therefore, a magnitude and stability of an effective damping force that can be provided by the rotating shaft mechanism for the entire terminal product have become a research focus of a person skilled in the art.

SUMMARY

This disclosure provides a rotating shaft mechanism and a terminal device, so that the rotating shaft mechanism can provide, for the entire terminal device, a damping force that meets a requirement.

According to a first aspect, a rotating shaft mechanism is provided. The rotating shaft mechanism may be applied to a foldable terminal device, the terminal device includes two housings, and the two housings may separately rotate around the rotating shaft mechanism, to fold and unfold the terminal device. The rotating shaft mechanism includes a main shaft assembly and a damper assembly, and the damper assembly is rotatably connected to the main shaft assembly. In specific disposing of the damper assembly, the damper assembly may include a cam member and a rotating assembly, the cam member is fastened on the main shaft assembly, and the cam member has a cam surface. The rotating assembly includes a rotating member and a sliding member, and the rotating member is rotatably connected to the main shaft assembly, to drive the entire rotating assembly to rotate around the main shaft assembly. In addition, the sliding member is able to slide in a direction toward or away from the main shaft assembly relative to the rotating member, and the sliding member further elastically abuts against the cam surface in a process in which the sliding member slides relative to the rotating member, to generate a damping force between the main shaft assembly and the damper assembly. An abutting force formed through elastic abutting may be transformed into resistance of relative rotation of the cam member and the rotating assembly, to generate the damping force between the main shaft assembly and the damper assembly. In addition, the elastic abutting force between the sliding member and the cam surface and a specific form of the cam surface are properly designed, to effectively improve a comfort degree of folding operation experience of the terminal device, and further ensure a life of the damper assembly.

The rotating member is a key structure for rotation of the rotating assembly around the main shaft assembly. In specific disposing, the rotating member may include a body portion and a connecting portion. The connecting portion is fixedly connected to the body portion, the connecting portion is configured to be rotatably connected to the main shaft assembly, the connecting portion may be disposed as an arc shaft, the main shaft assembly is correspondingly provided with an arc groove, and the arc shaft and the arc groove slidably cooperate, so that the rotating member and the main shaft assembly are rotatably connected by using a virtual shaft. Such a connection manner may facilitate a thin design of the rotating shaft mechanism. The body portion is provided with a sliding groove, and at least a part of the sliding member is accommodated in the sliding groove, so that at least the part of the sliding member can be accommodated in the sliding groove and slide in the sliding groove.

In addition to the foregoing disposing manner, in a possible implementation of this disclosure, the rotating member may further include a first rotating arm, a second rotating arm, and a connecting arm. The first rotating arm and the second rotating arm each are rotatably connected to the main shaft assembly, and an end portion of the first rotating arm and an end portion of the second rotating arm that face away from the main shaft assembly are fixedly connected by using the connecting arm. In addition, a part of the first rotating arm, a part of the second rotating arm, and a part of the connecting arm that are configured to enclose the sliding groove may be used as the body portion of the rotating member, and an end portion of the first rotating arm and an end portion of the second rotating arm that are configured to be rotatably connected to the main shaft assembly may be used as the connecting portion of the rotating member.

The rotating shaft mechanism may include two damper assemblies disposed in pairs, and the two damper assemblies synchronously rotate, to improve motion stability of the rotating shaft mechanism. In a possible implementation of this disclosure, the end portion that is of the first rotating arm and that is configured to be rotatably connected to the main shaft assembly may be provided with a gear structure, and the end portion that is of the second rotating arm and that is configured to be rotatably connected to the main shaft assembly is provided with a gear structure, so that the two damper assemblies synchronously rotate. In this way, a gear structure of a first rotating arm of one of the two damper assemblies disposed in pairs engages with a gear structure of a first rotating arm or a second rotating arm on a corresponding side of the other damper assembly. Similarly, a gear structure of a second rotating arm of one of the two damper assemblies disposed in pairs engages with a gear structure of a second rotating arm or a first rotating arm on a corresponding side of the other damper assembly. In this case, gear structures of rotating arms on a corresponding side engage with each other, so that the two damper assemblies synchronously move.

In addition, in a length direction of the main shaft assembly, a baffle plate is disposed on each of two sides of the two gear structures that engage with each other, and the baffle plate is configured to limit a center distance between the two gear structures, to improve stability of motion and transmission of the two gear structures.

In a possible implementation of this disclosure, in specific disposing of the sliding member, the sliding member may include a sliding block, and the sliding block may slide in the sliding groove in a direction toward or away from the main shaft assembly. In a possible implementation of this disclosure, a first sliding portion and a second sliding portion may be respectively disposed on two opposite groove walls of the sliding groove, and the sliding block is provided with a third sliding portion and a fourth sliding portion, to improve sliding stability of the sliding block in the sliding groove. The third sliding portion slidably cooperates with the first sliding portion, and the fourth sliding portion slidably cooperates with the second sliding portion.

In addition, an elastic element is further disposed in the sliding groove, and the sliding block is elastically connected to the elastic element. Because the cam member may be fastened on the main shaft assembly, in a process in which the sliding block slides in a direction toward or away from the main shaft assembly relative to the rotating member, the elastic element may press the sliding block toward the cam member, so that the sliding block elastically abuts against the cam member.

In a possible implementation of this disclosure, the sliding block may be further provided with a roller, the roller is rotatably connected to the sliding block by using a roller shaft, and the roller may elastically abut against the cam surface, so that friction between the sliding member and the cam member is rolling friction, to reduce abrasion caused in a process in which the sliding block moves along the cam surface.

In another possible implementation of this disclosure, an end portion of the sliding block may be further provided with an abutting portion, and the abutting portion abuts against the cam surface. In addition, a surface of the abutting portion may be an arc surface or a spherical surface, to also reduce abrasion between the sliding block and the cam surface.

According to a second aspect, a rotating shaft mechanism is further provided. The rotating shaft mechanism includes a main shaft assembly and a damper assembly, and the damper assembly is rotatably connected to the main shaft assembly. In specific disposing of the damper assembly, the damper assembly may include a cam member and a rotating assembly, the cam member is disposed on the rotating assembly, and the cam member has a cam surface. The rotating assembly includes a rotating member and a sliding member, and the rotating member is rotatably connected to the main shaft assembly, to drive the entire rotating assembly to rotate around the main shaft assembly. In addition, the sliding member may slide in a direction toward or away from the main shaft assembly relative to the rotating member, and the sliding member further elastically abuts against the cam surface in a process in which the sliding member rotates relative to the rotating member, to generate a damping force between the main shaft assembly and the damper assembly. An abutting force formed through elastic abutting may be transformed into resistance of relative rotation of the cam member and the rotating assembly, to generate the damping force between the main shaft assembly and the damper assembly. In addition, the elastic abutting force between the sliding member and the cam surface and a specific form of the cam surface are properly designed, to effectively improve a comfort degree of folding operation experience of the terminal device, and further ensure a life of the damper assembly.

In a possible implementation of this disclosure, in specific disposing of the rotating member, the rotating member includes a body portion and a connecting portion. The connecting portion is fixedly connected to the body portion, the connecting portion is configured to be rotatably connected to the main shaft assembly, the connecting portion may be disposed as an arc shaft, the main shaft assembly is correspondingly provided with an arc groove, and the arc shaft and the arc groove slidably cooperate, so that the rotating member and the main shaft assembly are rotatably connected by using a virtual shaft. Such a connection manner may facilitate a thin design of the rotating shaft mechanism. The body portion is provided with a sliding groove, and at least a part of the sliding member is accommodated in the sliding groove, so that at least the part of the sliding member can be accommodated in the sliding groove and slide in the sliding groove.

In specific disposing of the sliding member, the sliding member may include a sliding block and a rotating portion, the rotating portion is rotatably connected to the main shaft assembly, and the sliding block is rotatably connected to the rotating portion. In addition, an axis around which the rotating portion rotates around the main shaft assembly is parallel to but does not overlap an axis around which the rotating member rotates around the main shaft assembly. Therefore, in a process in which the rotating assembly rotates around the main shaft assembly, there is a phase difference between motion of the sliding block and motion of the rotating member, so that the sliding block slides in the sliding groove in a direction toward or away from the main shaft assembly.

The rotating portion may be provided with a gear structure, the rotating shaft mechanism may include two damper assemblies disposed in pairs, and gear structures of rotating portions of the two damper assemblies engage with each other, so that the two damper assemblies synchronously rotate, to improve motion stability of the rotating shaft mechanism.

In addition, in a length direction of the main shaft assembly, a baffle plate is disposed on each of two sides of the two gear structures that engage with each other, and the baffle plate is configured to limit a center distance between the two gear structures, to improve stability of motion and transmission of the two gear structures.

The body portion of the rotating member is further provided with a mounting groove, to dispose the cam member on the rotating assembly. There are two mounting grooves. In the length direction of the main shaft assembly, the two mounting grooves are respectively disposed on two sides of the sliding groove, and the mounting grooves communicate with the sliding groove through a via hole. After the cam member is mounted in the mounting groove, one end that is of the cam member and that is provided with the cam surface stretches into the via hole. The cam member may move in the mounting groove in a direction toward or away from the sliding groove.

In addition, an elastic element is disposed in the mounting groove, and the cam member is elastically connected to the elastic element. In this way, the elastic element may press the cam member toward the sliding block, so that the sliding block elastically abuts against the cam surface of the cam member.

In a possible implementation of this disclosure, an end portion that is of the sliding block and that faces the cam member may be further provided with an inclined surface. In this implementation solution, the cam surface of the cam member may abut against the inclined surface, to apply, to the sliding block, a pushing force in a direction away from the main shaft assembly. It can be understood that, the cam surface of the cam member and the inclined surface of the sliding block are properly designed, to adjust a damping force provided by the damper assembly, thereby meeting a requirement of a user for an operation feel.

In addition, the cam member may be further provided with a boss, and the sliding block limits motion of the boss toward a groove opening of the mounting groove, to limit the cam member in the mounting groove. In this way, the cam member can be prevented from falling off from the mounting groove, and structural stability of the rotating shaft mechanism can be improved.

In a possible implementation of this disclosure, in specific disposing of the main shaft assembly, the main shaft assembly may include a main inner shaft and a main outer shaft. The main inner shaft and the main outer shaft are fastened together to enclose accommodation space for accommodating another component of the rotating shaft mechanism. It can be understood that, a part that is of the rotating assembly and that is configured to be rotatably connected to the main shaft assembly may also be accommodated in the accommodation space.

According to a third aspect, a terminal device is provided. The terminal device includes a flexible display, a first housing, a second housing, and the rotating shaft mechanism according to the first aspect or the second aspect. The first housing and the second housing are respectively disposed on two sides of the rotating shaft mechanism, and the first housing and the second housing each are connected to a damper assembly on a corresponding side. The flexible display may continuously cover the first housing, the second housing, and the rotating shaft mechanism, and the flexible display is fixedly connected to the first housing and the second housing. In the technical solution of this disclosure, a sliding member elastically abuts against a cam member, to generate a damping force between a main shaft assembly and a damper assembly. In this way, enough support can be provided for the terminal device when the terminal device is in an unfolded state. In addition, a specific form of a cam surface of the cam member may be properly designed, to improve a comfort degree of experience of performing a folding operation on the terminal device by using the rotating shaft mechanism, and further ensure a life of the damper assembly.

REFERENCE NUMERALS

10: Rotating shaft mechanism; 101: Damper assembly; 1011: Cam member; 10111: Cam surface; 10112: Boss;

1012: Rotating assembly; 10121: Rotating member; 101211: Body portion; 1012111: sliding groove; 10121111: First sliding portion;

10121112: Second sliding portion; 1012112: Avoidance opening; 1012113: mounting groove; 1012114: Via hole;

101212: Connecting portion; 101213: First rotating arm; 1012131: First through hole; 1012132: Gear structure;

101214: Second rotating arm; 101215: connecting arm; 101216: First rotating shaft; 101217: Baffle plate;

1012171: Second through hole; 10122: Sliding member; 101221: Sliding block; 1012211: Mounting hole; 1012212: Guide rod;

1012213: Hollow region; 1012214: Abutting portion; 1012215: Third sliding portion; 1012216: Fourth sliding portion;

1012217: Third rotating shaft; 1012219: Inclined surface; 101222: Roller; 101223: Roller shaft;

101224: Elastic element; 101225: Rotating portion; 1012251: Second rotating shaft; 1012252: Gear structure;

10123: Cover; 102: Main shaft assembly; 1021: Main outer shaft; 10211: Pressure cap; 1022: Main inner shaft; 10221: Arc groove;

10222: First surface; 10223: Opening groove; 102231: Shaft hole; 103: Fastener; and

20: First housing; 30: Second housing; 40: Flexible display.

DESCRIPTION OF EMBODIMENTS

To make the objectives, technical solutions, and advantages of this disclosure clearer, the following further describes this disclosure in detail with reference to the accompanying drawings.

It should be noted that terms used in the following embodiments are merely intended to describe specific embodiments, but are not intended to limit this disclosure. As used in the specification and appended claims of the application, singular expressions "one", "a", "the", "the foregoing", "this", and "the one" are also intended to include expressions such as "one or more", unless the contrary is clearly indicated in the context.

Reference to "an embodiment", "some embodiments", or the like described in this specification indicates that one or more embodiments of this disclosure include a specific feature, structure, or characteristic described with reference to the embodiments. Therefore, in this specification, statements such as "in an embodiment", "in some embodiments", "in other embodiments", and "in some other embodiments" that appear at different places in this specification do not necessarily mean reference to a same embodiment, instead, they mean "one or more but not all of the embodiments", unless otherwise specifically emphasized. The terms "include", "comprise", "have", and their variants all mean "include but is not limited to", unless otherwise specifically emphasized.

Figure 1:
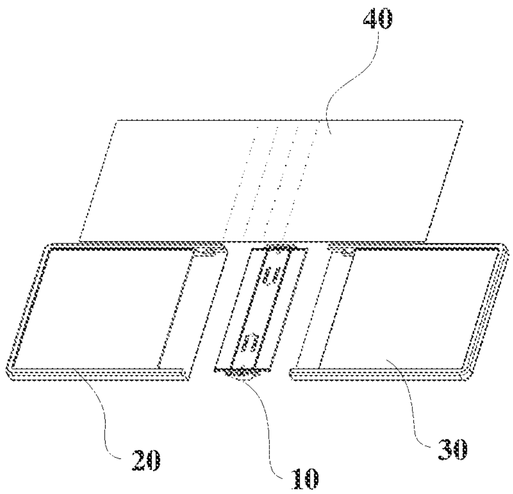
FIG. 1 is a schematic diagram of an exploded structure of a terminal device according to an embodiment of this disclosure.

For ease of understanding a rotating shaft mechanism provided in embodiments of this disclosure, the following first describes an application scenario of the rotating shaft mechanism. The rotating shaft mechanism may be applied to a terminal device, and in particular, is applied to a foldable terminal device. For example, the terminal device may be but is not limited to a mobile phone, a personal digital assistant (PDA), a notebook computer, or a tablet computer. FIG. 1 shows a structure of a foldable terminal device according to a possible embodiment of this disclosure. The foldable terminal device may usually include a rotating shaft mechanism 10, a first housing 20, a second housing 30, and a flexible display 40. The first housing 20 and the second housing 30 are respectively disposed on two sides of the rotating shaft mechanism 10. The flexible display 40 covers the first housing 20, the second housing 30, and the rotating shaft mechanism 10, and may be stuck to the first housing 20, the second housing 30, and the rotating shaft mechanism 10.

Figure 2:
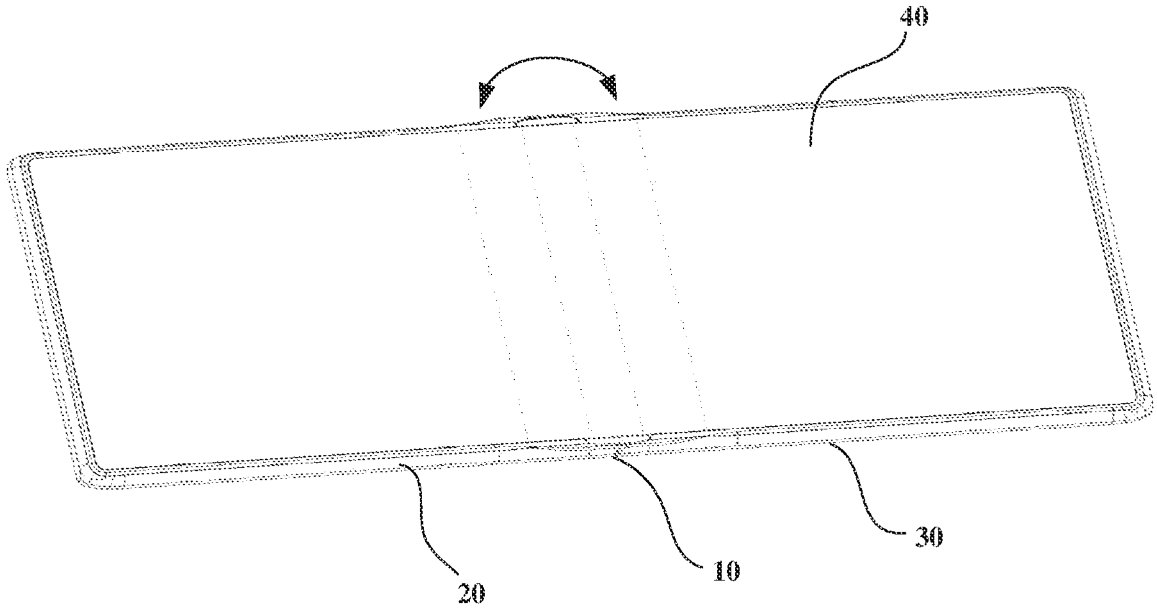
FIG. 2 is a schematic diagram of a structure of a rotating shaft mechanism in an unfolding state according to an embodiment of this disclosure.

In this embodiment of this disclosure, at least one of the first housing 20 and the second housing 30 may be rotatably connected to the rotating shaft mechanism 10, so that the terminal device can be switched among an unfolded state, a folded state, and an intermediate state between the unfolded state and the folded state (briefly referred to as an intermediate state below). In a specific implementation, first refer to FIG. 2. FIG. 2 shows a structure of a terminal device in an unfolded state. In the unfolded state, the first housing 20 and the second housing 30 are respectively disposed on two sides of the rotating shaft mechanism 10. In addition, a surface of the first housing 20, a surface of the second housing 30, and a surface of the rotating shaft mechanism 10 that are configured to be in contact with the flexible display 40 are approximately in a same plane. Because the flexible display 40 is stuck to the first housing 20, the second housing 30, and the rotating shaft mechanism 10, the flexible display

40 may also be in an unfolded state under a support action of the first housing 20, the second housing 30, and the rotating shaft mechanism 10.

In this disclosure, the terminal device may be an outwardly foldable terminal device, or may be an inwardly foldable terminal device. In a process in which the outwardly foldable terminal device is switched from the unfolded state to the folded state, the flexible display 40 is always located on an outer side of the terminal device. In a process in which an inwardly foldable electronic device is switched from the unfolded state to the folded state, the flexible display 40 is always located on an inner side of the terminal device. The outwardly foldable terminal device is used as an example. In a process of folding the terminal device, the first housing 20 and the second housing 30 may rotate relative to each other in a direction shown by a curve with arrows in FIG. 2, and the flexible display 40 is bent along with the first housing 20 and the second housing 30.

Because the flexible display 40 is a key component of the foldable terminal device, in a process in which the foldable terminal device switches a folding mode between the unfolded state, the folded state, and the intermediate state, if the first housing 20, the second housing 30, and the rotating shaft mechanism 10 of the foldable terminal device cannot provide stable support for the flexible display 40, the flexible display 40 may have an abnormal display when being pulled or pressed by an external force. It can be understood, from the descriptions of the terminal device in the foregoing embodiment, that folding of the entire terminal device needs to depend on cooperation of the rotating shaft mechanism 10. Based on this, a damper assembly may be usually disposed in the rotating shaft mechanism 10, so that in the process in which the terminal device switches the folding mode, the damper assembly can provide a reliable damping force for the entire terminal device, to stably support the flexible display 40.

Currently, the damping force provided by the damper assembly is usually implemented based on friction generated by relative motion between components in contact. However, large friction is generated between the components in contact, to provide a damping force that meets a requirement. Long-time use of the components may easily cause wear, and consequently, the damping force of the damper assembly may be reduced.

The rotating shaft mechanism provided in this disclosure aims to resolve the foregoing problem, to reduce a degree to which the damping force of the damper assembly of the rotating shaft mechanism is reduced, and prolong a service life of the damper assembly, so as to provide effective support for the terminal device to which the rotating shaft mechanism is applied.

Figure 3:
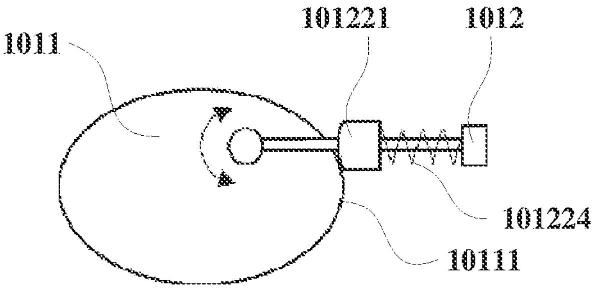
FIG. 3 is a schematic diagram of a structure of a damper assembly of a rotating shaft mechanism according to an embodiment of this disclosure.

It can be learned, from the descriptions in the foregoing embodiment, that generation of the damping force of the damper assembly may depend on an acting force between components that make relative motion. FIG. 3 is a schematic diagram of a structure of a damper assembly according to an embodiment of this disclosure. The damper assembly includes two parts that may rotate relative to each other, and the two parts are a cam member 1011 and a rotating assembly 1012. The cam member 1011 is a member having a curved contour. In this disclosure, a surface that is of the cam member 1011 and that includes the curved contour is referred to as a cam surface 10111 of the cam member 1011. The rotating assembly 1012 is provided with a guide rail, and is further provided with a sliding block 101221 that may slide along the guide rail. In a process in which the rotating assembly 1012 performs relative rotation, the sliding block 101221 may slide along the guide rail in a direction toward or away from a rotation center of the rotating assembly 1012.

In addition, the damper assembly 101 may be further provided with an elastic element 101224. The sliding block 101221 directly or indirectly abuts against the cam surface 10111 of the cam member 1011 under an action of the elastic element 101224 (for example, a spring); or the cam member 1011 abuts against the sliding block 101221 under an action of the elastic element 101224, so that the sliding block 101221 and the cam surface 10111 elastically abut against each other. In this way, when the cam member 1011 and the rotating assembly 1012 rotate relative to each other, the sliding block 101221 may slide along the guide rail under a pushing action of the cam surface 10111, to compress or stretch the elastic element 101224 to different degrees. Because the elastic element 101224 is compressed or stretched to different degrees, different elastic forces are accumulated by the elastic element 101224, so that the cam member 1011 and the rotating assembly 1012 are subject to different resistance in a relative rotation process. In this way, a variable damping effect between the cam member 1011 and the rotating assembly 1012 that rotate relative to each other can be achieved. It can be understood that a specific form of the cam surface 10111 has great impact on a degree to which the elastic element 101224 is compressed or stretched. Therefore, the damping force provided by the damper assembly 101 can be adjusted by adjusting the specific form of the cam surface 10111.

The damper assembly 101 of the rotating shaft mechanism 10 provided in this disclosure may be designed based on such a structural principle. To facilitate understanding of the rotating shaft mechanism 10 provided in this embodiment of this disclosure, the following describes a structure of the rotating shaft mechanism 10 in detail with reference to the accompanying drawings.

Figure 4A:
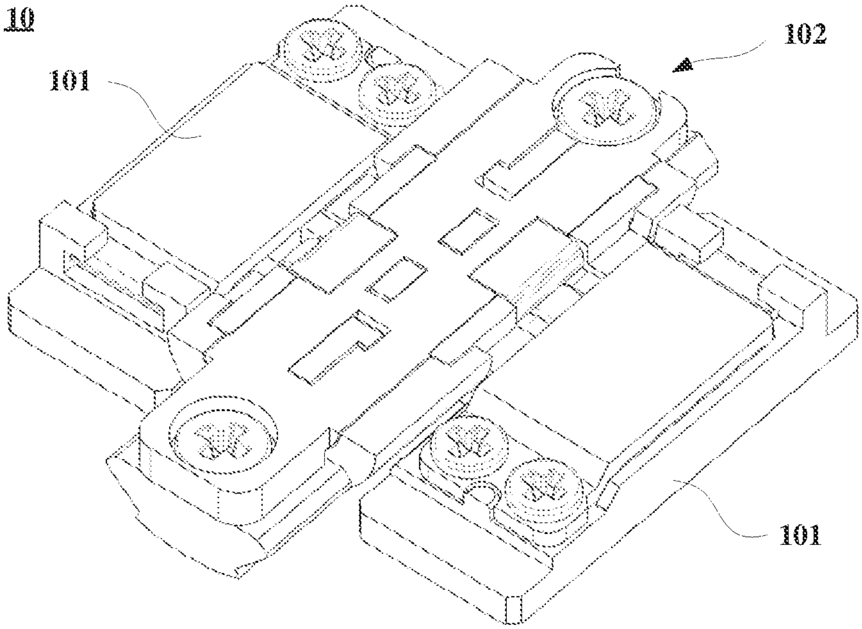
FIG. 4*a* is a schematic diagram of a structure of a rotating shaft mechanism according to an embodiment of this disclosure.
Figure 4B:
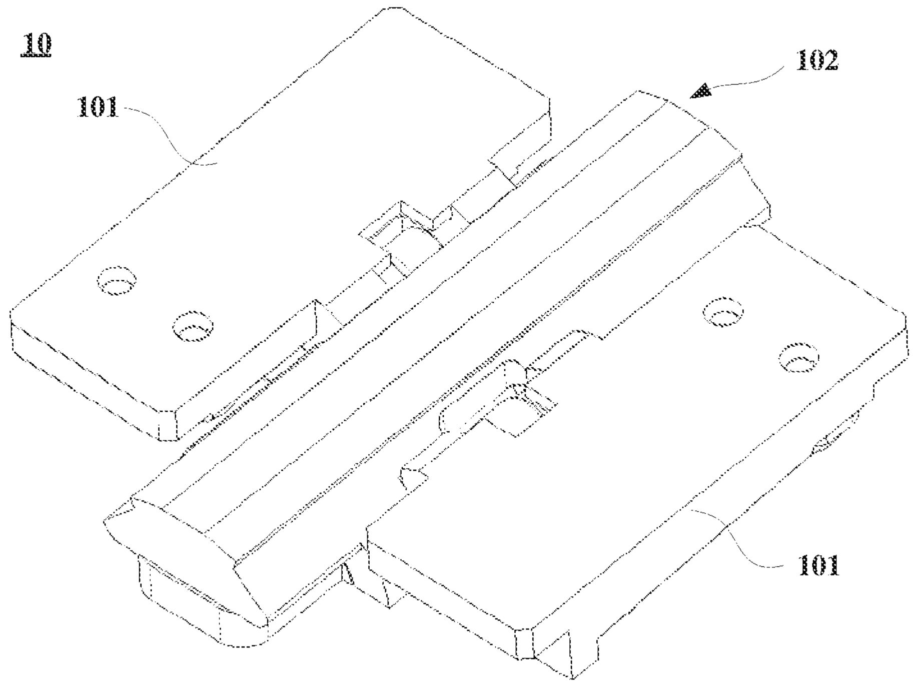
FIG. 4*b* is a schematic diagram of a structure existing when the rotating shaft mechanism in FIG. 4*a* is viewed from another perspective.

FIG. 4*a* is a schematic diagram of a structure of a rotating shaft mechanism 10 according to a possible embodiment of this disclosure. FIG. 4*b* is a schematic diagram of a structure existing when the rotating shaft mechanism 10 in FIG. 4*a* is viewed from another perspective. The rotating shaft mechanism 10 may include a damper assembly 101 and a main shaft assembly 102. The main shaft assembly 102 may be used as a bearing component of the rotating shaft mechanism 10, to be configured to bear the damper assembly 101. The damper assembly 101 may be rotatably connected to the main shaft assembly 102. In this disclosure, an axis direction of a rotating shaft around which the damper assembly 101 rotates may be defined as a length direction of the main shaft assembly 102.

Still refer to FIG. 4*a* and FIG. 4*b*. In this embodiment of this disclosure, there may be a plurality of damper assemblies 101, and the plurality of damper assemblies 101 are separately disposed on two sides that are of the main shaft assembly 102 and that are perpendicular to the length direction of the main shaft assembly 102. In this way, a damper assembly 101 on one side of the main shaft assembly 102 may be fixedly connected to the first housing 20 of the terminal device mentioned in the embodiment shown in FIG. 1. Similarly, a damper assembly 101 on the other side of the main shaft assembly 102 is fixedly connected to the second housing 30 of the terminal device mentioned in the embodiment shown in FIG. 1, so that a damping force generated by the damper assembly 101 can be transferred to a corresponding housing, to provide reliable support for the entire terminal device. It can be understood that damper assemblies 101 disposed on a same side may be directly in contact with and fastened to a housing, or the damper assembly 101 may be fastened to a housing by using another possible structure, to indirectly fasten the damper assembly 101 to the housing.

In a possible embodiment of this disclosure, there may be a same quantity of damper assemblies 101 located on each of the two sides of the main shaft assembly 102. In this way, the damper assemblies 101 can provide almost a same damping force for two housings of the terminal device, to help improve structural stability of the terminal device. In addition, when there is a same quantity of damper assemblies 101 located on each of the two sides of the main shaft assembly 102, damper assemblies 101 on the two sides of the main shaft assembly 102 may be disposed in a one-to-one correspondence or disposed in a staggered manner. This is not specifically limited in this disclosure.

Figure 5:
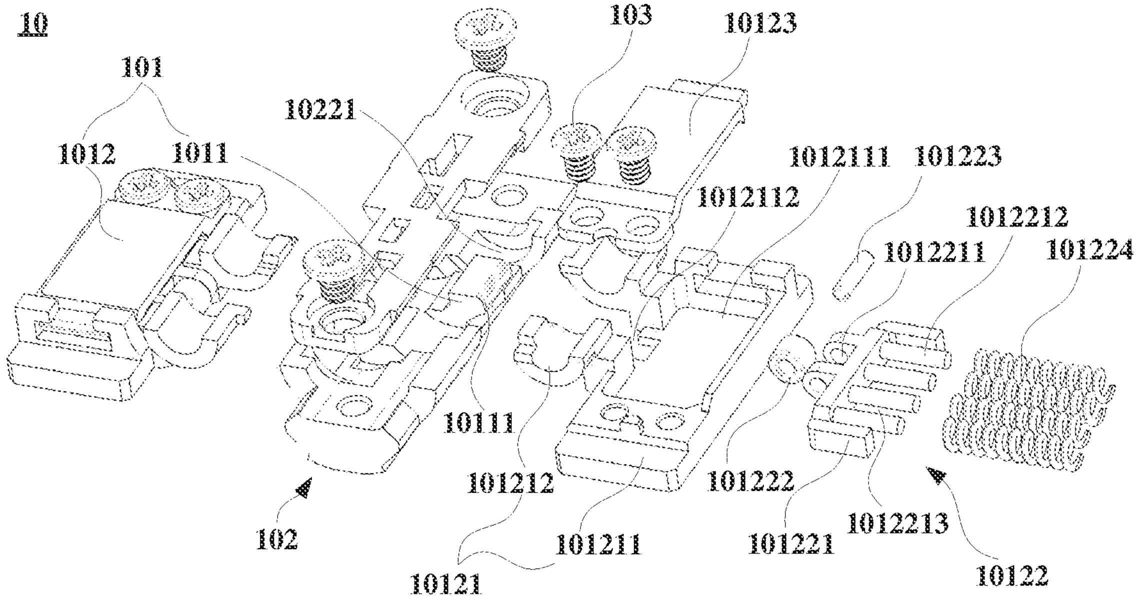
FIG. 5 is a schematic diagram of an exploded structure of a rotating shaft mechanism according to an embodiment of this disclosure.
Figure 6:
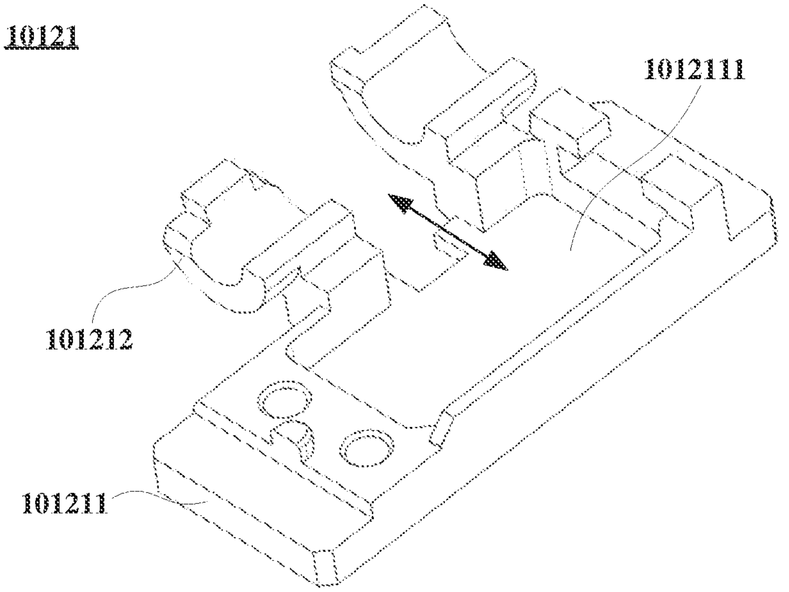
FIG. 6 is a schematic diagram of a structure of a rotating member according to an embodiment of this disclosure.

FIG. 5 is a schematic diagram of an exploded structure of a rotating shaft mechanism 10 according to an embodiment of this disclosure. In this embodiment of this disclosure, the damper assembly 101 may include a cam member 1011 and a rotating assembly 1012. The cam member 1011 may be fastened on the main shaft assembly 102, and the cam member 1011 has a cam surface 10111. The rotating assembly 1012 includes a rotating member 10121 and a sliding member 10122, and the rotating member 10121 may rotate around the main shaft assembly 102, to drive the rotating assembly 1012 to rotate around the main shaft assembly 102. In a specific implementation, FIG. 6 shows a structure of a rotating member 10121 according to an embodiment of this disclosure. The rotating member 10121 may include a body portion 101211 and a connecting portion 101212, the connecting portion 101212 is disposed on one side of the body portion 101211, and the connecting portion 101212 is fixedly connected to the body portion 101211. It can be understood that, in the embodiment shown in FIG. 6, the rotating member may be of an integral structure, so that structural reliability of the rotating member 10121 can be effectively improved, to improve motion stability of the rotating member 10121. In some other embodiments of this disclosure, the rotating member 10121 may alternatively be of a split structure, and the body portion 101211 and the connecting portion 101212 may be fixedly connected by using a fastener 103 such as a bolt, so that a structure of the rotating member 10121 can be flexibly set.

Refer to both FIG. 5 and FIG. 6. The connecting portion 101212 may be configured to be rotatably connected to the main shaft assembly 102. In this embodiment, the connecting portion 101212 may be disposed as an arc shaft. There may be a plurality of arc shafts, to improve reliability of connecting the connecting portion 101212 and the main shaft assembly 102. In addition, the main shaft assembly 102 is provided with an arc groove 10221, and the arc groove 10221 and the arc shaft are disposed in a one-to-one correspondence. In this way, each arc shaft may be accommodated in a corresponding arc groove 10221, and an arc surface of the arc shaft may slide along a groove wall of the arc groove 10221, to implement relative rotation of the connecting portion 101212 and the main shaft assembly 102. It can be understood that, in this embodiment, the arc shaft and the arc groove 10221 slidably cooperate, to form a virtual shaft, so that the rotating member 10121 and the main shaft assembly 102 are rotatably connected by using the virtual shaft. In this way, a structure for rotatably connecting the rotating member 10121 and the main shaft assembly 102 can occupy small space of the main shaft assembly 102, to help implement miniaturization and a thin design of the rotating shaft mechanism 10. In some other possible embodiments of this disclosure, the rotating member 10121 and the main shaft assembly 102 may alternatively be rotatably connected by using a solid shaft, to effectively simplify the structure of the rotating shaft mechanism 10, and reduce management and control difficulty of a manufacturing process of the rotating shaft mechanism 10.

Still refer to FIG. 5 and FIG. 6. In specific disposing of the body portion 101211 of the rotating member 10121, the body portion 101211 is provided with a sliding groove 1012111, at least a part of the sliding member 10122 is accommodated in the sliding groove 1012111, and the sliding member 10122 may slide in the sliding groove 1012111 in a direction (a direction shown by an arrow in FIG. 6) toward or away from the main shaft assembly 102. In addition, one end of the sliding member 10122 may abut against the cam surface 10111 of the cam member 1011. It can be understood that an abutting force between the sliding member 10122 and the cam member 1011 may be transformed into a damping force of the damper assembly 101 and output to an outside.

In specific disposing of the sliding member 10122, the sliding member 10122 includes a sliding block 101221, and the sliding block 101221 is accommodated in the sliding groove 1012111 of the body portion 101211 of the rotating member 10121 and may slide in the sliding groove 1012111 in a direction toward or away from a rotation center of the rotating member 10121 relative to the body portion 101211 of the rotating member 10121. In various embodiments of this disclosure, a specific shape of the sliding block 101221 is not limited. For example, the sliding block 101221 may be of a regular shape such as a rectangle or a trapezoid, or may be of an irregular shape.

Because the sliding member 10122 may abut against the cam member 1011, the sliding member 10122 may be further provided with a roller 101222, the roller 101222 may be rotatably connected to an end portion of the sliding block 101221 by using a roller shaft 101223, and the roller 101222 may abut against the cam member 1011, so that a friction pair between the sliding member 10122 and the cam member 1011 is a rolling friction pair, to reduce wear of the sliding member 10122. In a specific implementation, refer to FIG. 5. One end portion of the sliding block 101221 is provided with a mounting hole 1012211, and two end portions of the roller shaft 101223 each are mounted in one mounting hole 1012211. The roller shaft 101223 may be fixedly connected to the sliding block 101221 after being mounted in the mounting hole 1012211, and the roller 101222 may rotate around the roller shaft 101223, so that the roller 101222 and the sliding block 101221 are rotatably connected. In another possible embodiment of this disclosure, the roller 101222 may be further fixedly connected to the roller shaft 101223, and the roller shaft 101223 may rotate in the mounting hole 1012211 after being mounted in the mounting hole 1012211, so that the roller 101222 and the sliding block 101221 are rotatably connected.

It can be learned, from the foregoing descriptions of the sliding member 10122, that the roller 101222 is located on a side that is of the sliding block 101221 and that faces the main shaft assembly 102. In addition, in a process in which the sliding member 10122 slides in the sliding groove 1012111 of the body portion 101211 of the rotating member 10121, the roller 101222 also slides in the sliding groove 1012111 along with the sliding block 101221 when abutting against the cam surface 10111 of the cam member 1011. Still refer to FIG. 5. To avoid interference in contact between the roller 101222 and the cam member 1011, an avoidance opening 1012112 is further disposed on a side that is of the sliding groove 1012111 of the rotating member 10121 and that faces the main shaft assembly 102, and the roller 101222 may extend from the avoidance opening 1012112 to an outside of the sliding groove 1012111, to contact the cam member 1011.

Refer to FIG. 5. In some embodiments of this disclosure, the sliding block 101221 may be further connected to an elastic element 101224, to implement reciprocal motion of the sliding member 10122 in the sliding groove 1012111 in a direction toward and away from the main shaft assembly 102. The elastic element 101224 may be but is not limited to a spring or an elastomer. In a specific implementation, the elastic element 101224 may be accommodated in the sliding groove 1012111, the elastic element 101224 is disposed on a side that is of the sliding block 101221 and that faces away from the main shaft assembly 102, one end of the elastic element 101224 is elastically connected to the sliding block 101221, and the other end is elastically connected to a groove wall of the sliding groove 1012111, to press the sliding block 101221 toward the cam member 1011. In this embodiment, a specific quantity of elastic elements may be set based on a magnitude of a damping force that needs to be provided by the damper assembly 101, space of the sliding groove 1012111, and the like.

When the elastic element 101224 is a spring, refer to FIG. 5. A guide rod 1012212 may be further disposed on a side that is of the sliding block 101221 and that faces away from the main shaft assembly 102. In this way, the elastic element 101224 can be sleeved on the guide rod 1012212, to facilitate mounting of the elastic element 101224 and the sliding block 101221, and further avoid a problem that arching, or the like occurs when the elastic element 101224 is elastically deformed. Therefore, reliability of sliding the sliding block 101221 in the sliding groove 1012111 is improved.

In addition, a hollow region 1012213 may be further disposed on a side that is of the sliding block 101221 and that faces away from the main shaft assembly 102, and the guide rod 1012212 in the foregoing embodiment may be disposed in the hollow region 1012213. In this way, a structure of the sliding member 10122 can be compact, so that a volume of the rotating assembly 1012 can be small, to help implement a miniaturization design of the rotating shaft mechanism 10. In addition, at least a part that is of the elastic element 101224 and that is sleeved on the guide rod 1012212 may also be accommodated in the hollow region 1012213, to help limit the elastic element 101224, and improve motion stability of the elastic element 101224.

It should be noted that, in some embodiments of this disclosure, the sliding block 101221 may be of an integral structure. In this case, the hollow region 1012213 may be a groove disposed on the sliding block 101221. In some other embodiments of this disclosure, the sliding block 101221 may alternatively be of a split structure. In this embodiment, the hollow region 1012213 may be a region enclosed by fixedly connecting a plurality of stoppers that form the sliding block 101221.

It can be understood that, in the embodiment shown in FIG. 5, the elastic element 101224 may be a compression spring, and may be compressed and accumulate an elastic acting force in a process in which the sliding block 101221 slides along the sliding groove 1012111. The elastic acting force acts on the sliding block 101221, to press the sliding block 101221 toward the cam member 1011, so that the sliding block 101221 abuts against the cam member 1011.

Still refer to FIG. 5. The rotating assembly 1012 may further include a cover 10123, and the cover 10123 covers an opening of the sliding groove 1012111. In addition, in this embodiment of this disclosure, the cover 10123 and the rotating member 10121 may be threaded by using a fastener 103 such as a screw or a bolt, may be snap-fitted by using a snap-fit, or the like, or may be fixedly connected through sticking by using an adhesive, or the like. This constitutes no limitation. It can be understood that, after the cover 10123 covers the sliding groove 1012111, a sliding groove cavity may be formed between the cover 10123 and the rotating member 10121. At least the part of the sliding member 10122 mentioned in the foregoing embodiment may be accommodated in the sliding groove cavity, to prevent the sliding member 10122 from falling off from the rotating member 10121.

Figure 7:
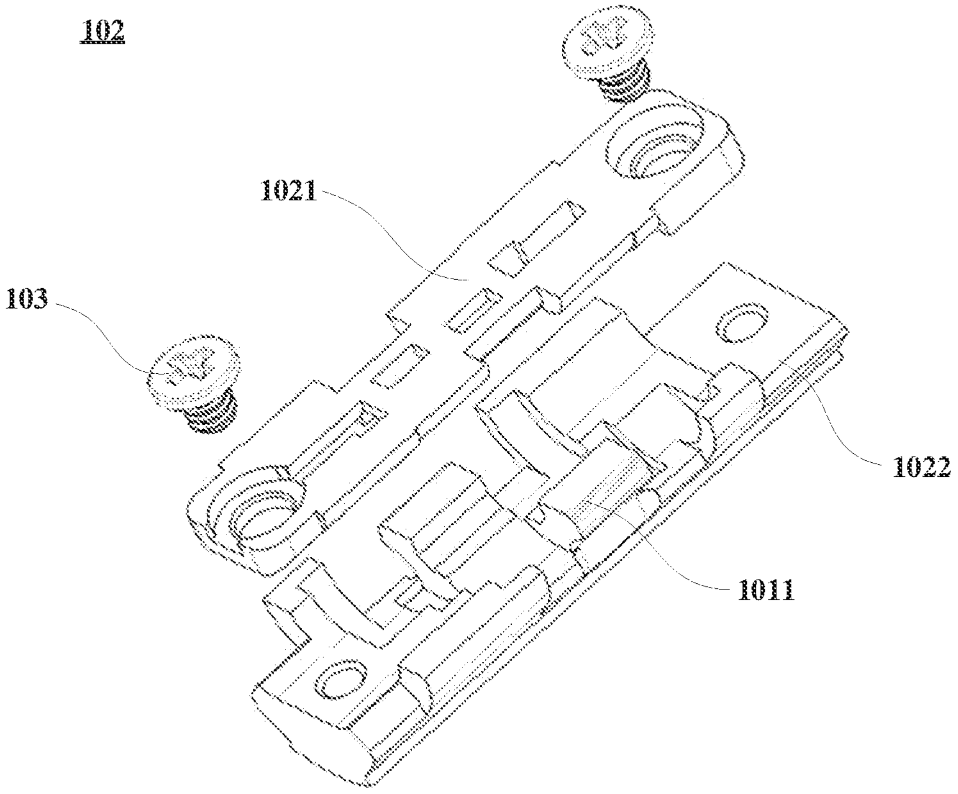
FIG. 7 is a schematic diagram of an exploded structure of a main shaft assembly according to an embodiment of this disclosure.

FIG. 7 is an exploded diagram of a main shaft assembly 102 according to an embodiment of this disclosure. In this disclosure, the main shaft assembly 102 may include a main outer shaft 1021 and a main inner shaft 1022, and the main outer shaft 1021 may be but is not limited to an integral plane structure. The main inner shaft 1022 and the main outer shaft 1021 are fastened together, and accommodation space for accommodating another component of the rotating shaft mechanism 10 may be enclosed between the main inner shaft 1022 and the main outer shaft 1021. In addition, after the main outer shaft 1021 and the main inner shaft 1022 are fastened, the main outer shaft 1021 and the main inner shaft 1022 may be connected by using a fastener 103 such as a bolt or a screw, or may be fixedly connected by using a snap-fit. This constitutes no limitation.

Figure 8:
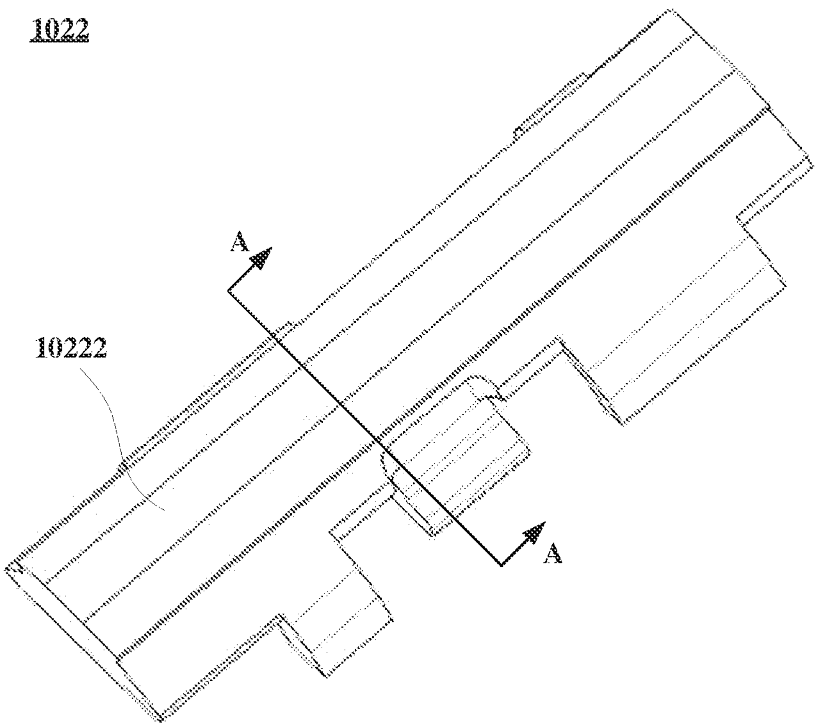
FIG. 8 is a schematic diagram of a structure of a main inner shaft according to an embodiment of this disclosure.

FIG. 8 is a schematic diagram of a structure of a main inner shaft 1022 according to a possible embodiment of this disclosure. The main inner shaft 1022 has a first surface 10222 configured to support the flexible display 40. In a possible embodiment of this disclosure, the first surface 10222 may be an arc surface. In this way, when the flexible display 40 shown in FIG. 1 is folded along with the rotating shaft mechanism, the first surface 10222 may be configured to support the flexible display 40. In addition, a radian of the first surface 10222 may be designed based on a bending radian of a bending part of the flexible display 40, to reduce a risk that the flexible display 40 is damaged when being pressed or pulled.

Figure 9:
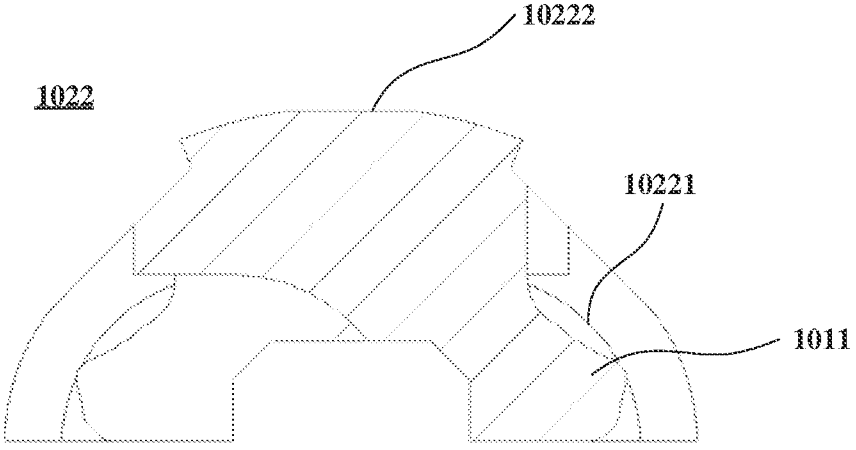
FIG. 9 is a sectional view along A-A in FIG. 8.

Refer to both FIG. 8 and FIG. 9. FIG. 9 is a sectional view along A-A of the main inner shaft 1022 in FIG. 8. The cam member 1011 of the rotating assembly 1012 mentioned in the foregoing embodiment may be fastened on the main inner shaft 1022. In some possible embodiments of this disclosure, the cam member 1011 and the main inner shaft 1022 may alternatively be of an integral structure, to simplify the structure of the rotating shaft mechanism 10, and improve the structural stability of the rotating shaft mechanism 10.

After the structure of the rotating shaft mechanism 10 in the foregoing embodiment of this disclosure is learned of, the following describes, with reference to the accompanying drawings, a damping force generated by the damper assembly 101 when the damper assembly 101 rotates at different angles relative to the main shaft assembly 102.

Figure 10:
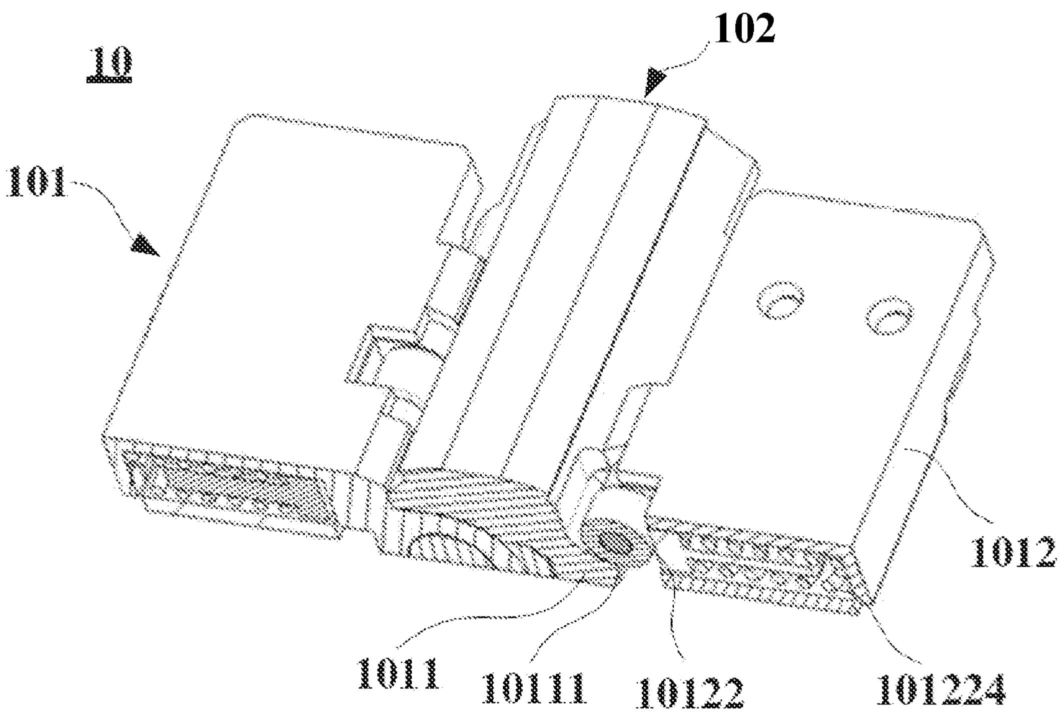
FIG. 10 is a schematic diagram of a partial structure of a rotating shaft mechanism according to an embodiment of this disclosure.

First, FIG. 10 is a schematic diagram of a partial structure of a rotating shaft mechanism 10 in an unfolded state. In the unfolded state, the sliding member 10122 elastically abuts against the cam surface 10111 of the cam member 1011 under an elastic force of the elastic element 101224. An abutting force formed through elastic abutting may be transformed into resistance of relative rotation of the cam member 1011 and the rotating assembly 1012, to generate the damping force between the main shaft assembly 102 and the damper assembly 101. In this way, the rotating shaft mechanism 10 can be maintained in the unfolded state, to provide enough support for the terminal device.

Figure 11A:
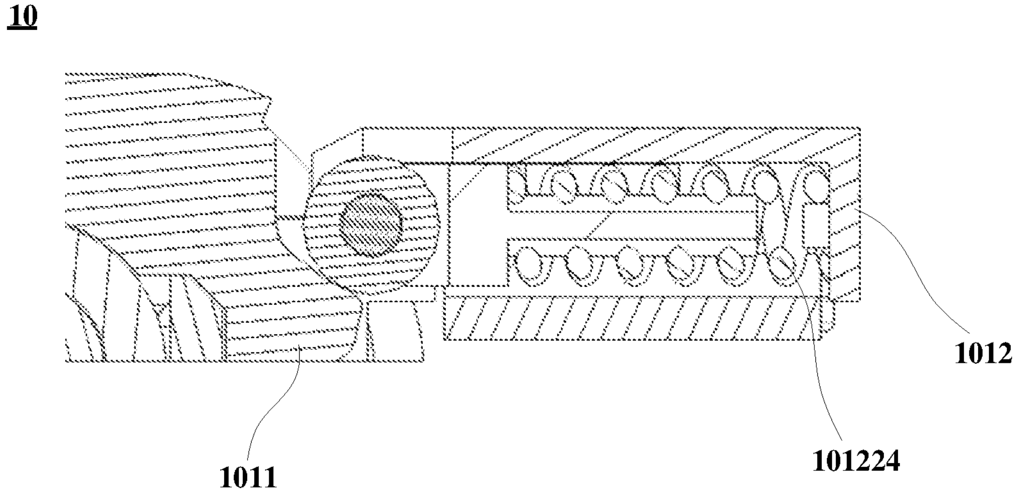
FIG. 11*a* to FIG. 11*d* are sectional views of a rotating shaft mechanism at different folding degrees according to an embodiment of this disclosure.
Figure 11B:
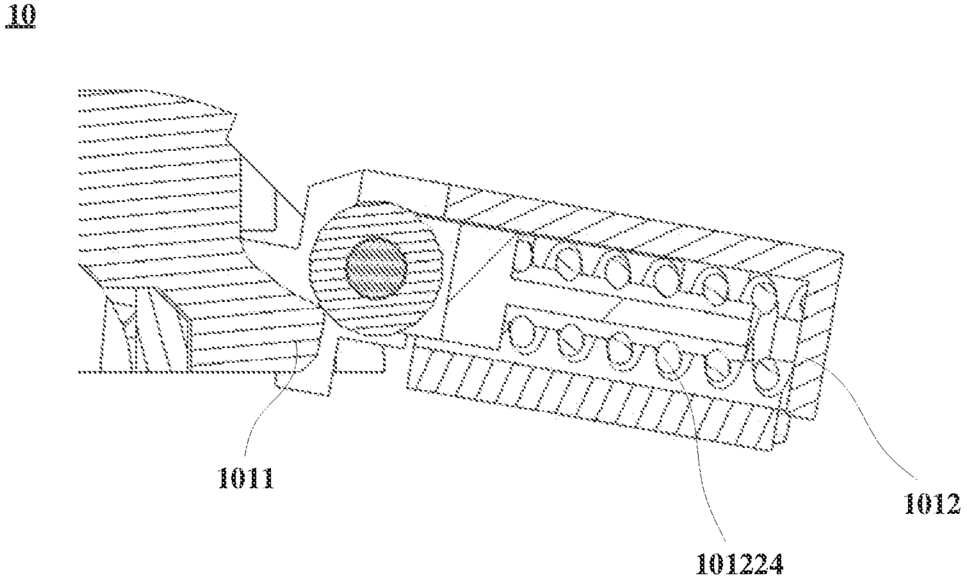
Figure 11C:
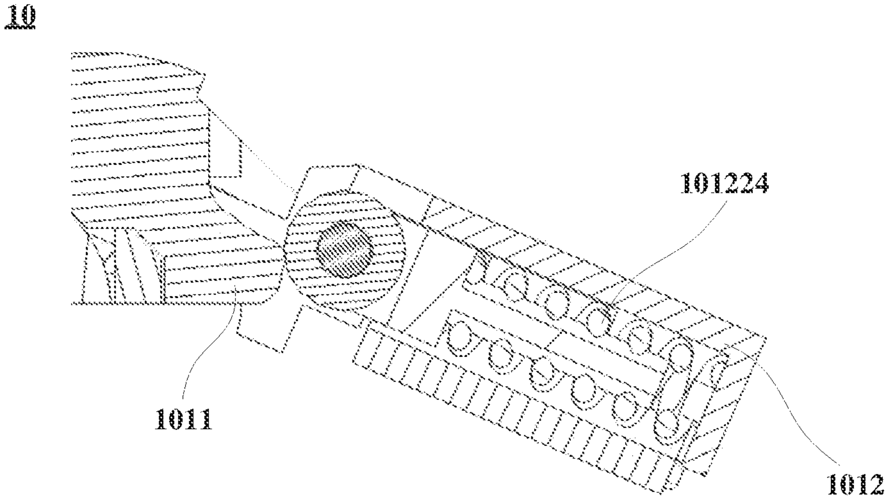
Figure 11D:
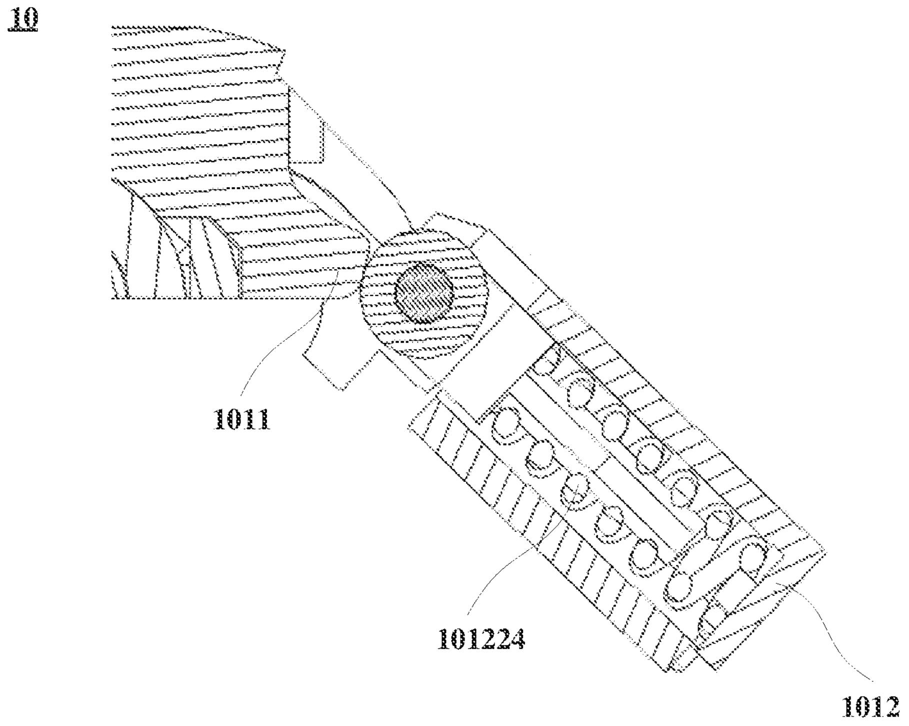

Second, refer to FIG. 11*a* to FIG. 11*d* together. FIG. 11*a* is a sectional view of a rotating shaft mechanism 10 in an unfolded state. FIG. 11*b* to FIG. 11*d* each are a sectional view of a rotating shaft mechanism 10 in an intermediate state at a different folding degree. It can be understood that FIG. 11*a* to FIG. 11*d* each show only a structure on one side of the rotating shaft mechanism 10, and a structure on the other side of the rotating shaft mechanism 10 is similar to the structure. Therefore, in this embodiment of this disclosure, the structure on one side of the rotating shaft mechanism 10 shown in FIG. 11*a* to FIG. 11*d* is only used as an example for description.

Refer to FIG. 11*a* to FIG. 11*d*. It can be found, in comparison of the rotating shaft mechanism 10 at different folding degrees, that, when the rotating shaft mechanism 10 is at different folding degrees, the elastic element 101224 is compressed or stretched to different degrees, and therefore, stores different elastic forces, so that the rotating assembly 1012 is subject to different damping forces in a process in which the rotating assembly 1012 rotates relative to the cam member 1011, to achieve a variable damping effect of the rotating shaft mechanism 10.

Figure 12:
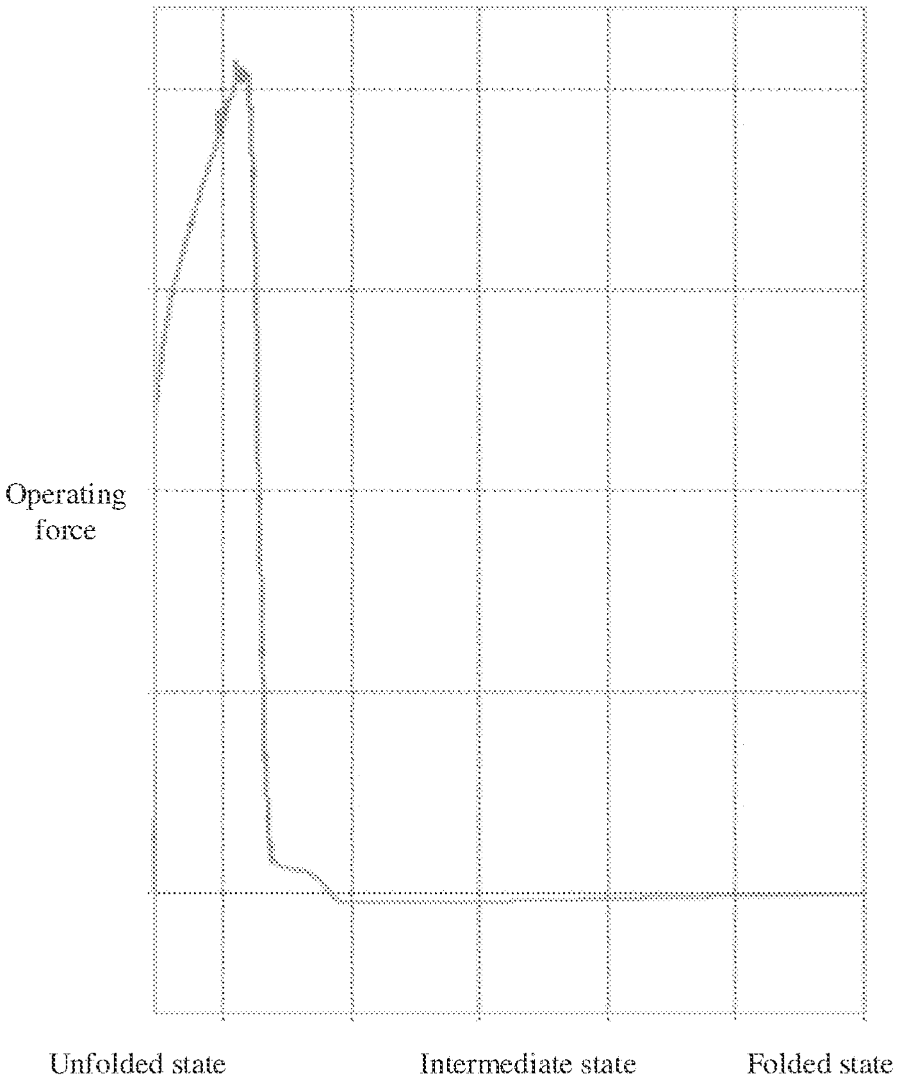
FIG. 12 is a schematic diagram of an operating force in a process in which a rotating shaft mechanism is switched from an unfolded state to a folded state according to an embodiment of this disclosure.

It can be learned from the descriptions in the foregoing embodiment that, a specific form of a contour curve of the cam surface 10111 that forms the cam member 1011 may be designed based on operating forces required by the rotating shaft mechanism 10 at different folding degrees. FIG. 12 is a schematic diagram of an operating force in a process in which a rotating shaft mechanism 10 is switched from an unfolded state to a folded state according to an embodiment of this disclosure. It can be understood that, in FIG. 12, a horizontal coordinate represents a process of switching from an unfolded state to a folded state, and a vertical coordinate represents a magnitude of the operating force.

With reference to FIG. 10 and FIG. 12, because the unfolded state is a common use state of the terminal device, in this state, the rotating shaft mechanism 10 needs to provide a large damping force to maintain flatness of the entire device. During folding of the terminal device, the rotating member 10121 rotates around the main shaft assembly 102, and the sliding member 10122 moves along the cam surface 10111 of the cam member 1011 and compresses the elastic element 101224 under an action of the cam member 1011. It can be understood that, the elastic force of the elastic element 101224 and the specific form of the cam surface 10111 are properly designed, to effectively improve a comfort degree of folding operation experience of the terminal device, and further ensure a life of the damper assembly.

Figure 13A:
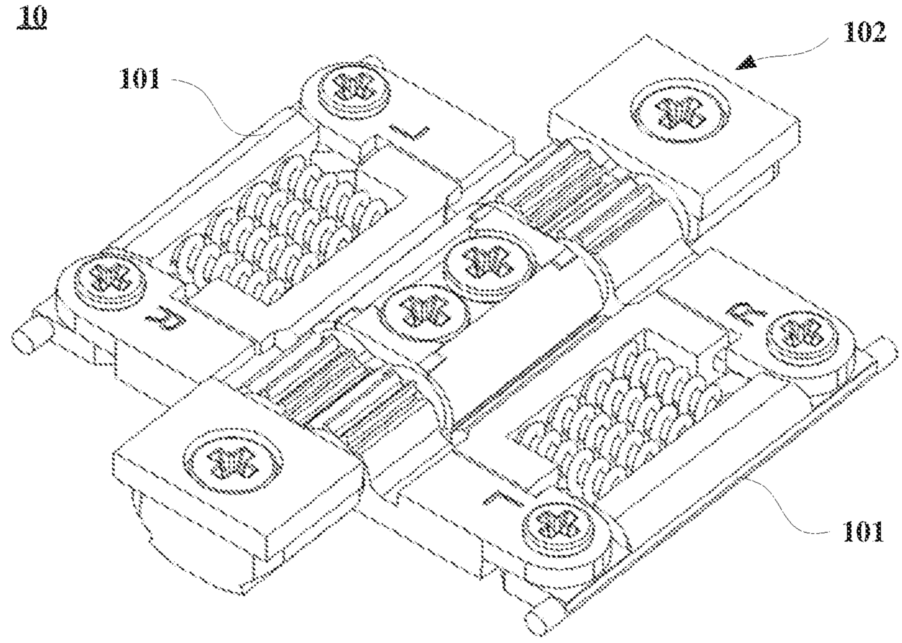
FIG. 13*a* is a schematic diagram of a structure of a rotating shaft mechanism according to another embodiment of this disclosure.
Figure 13B:
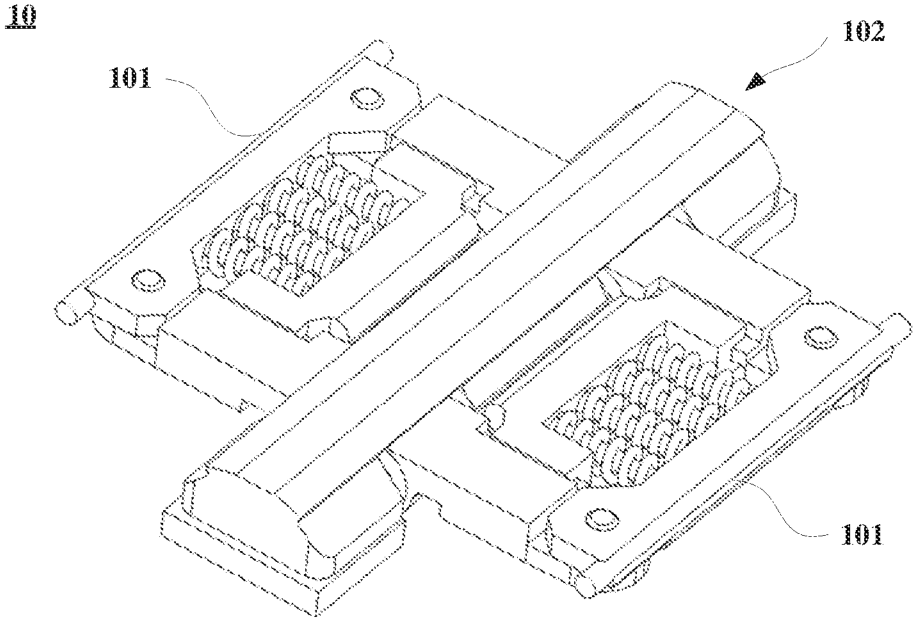
FIG. 13*b* is a schematic diagram of a structure existing when the rotating shaft mechanism in FIG. 13*a* is viewed from another perspective.

FIG. 13*a* is a schematic diagram of a structure of a rotating shaft mechanism 10 according to another embodiment of this disclosure. FIG. 13*b* is a schematic diagram of a structure existing when the rotating shaft mechanism 10 in FIG. 13*a* is viewed from another perspective. A difference between the rotating shaft mechanism 10 in this embodiment and the rotating shaft mechanism 10 provided in the foregoing embodiment mainly lies in a specific disposing manner of a damper assembly 101.

Figure 14:
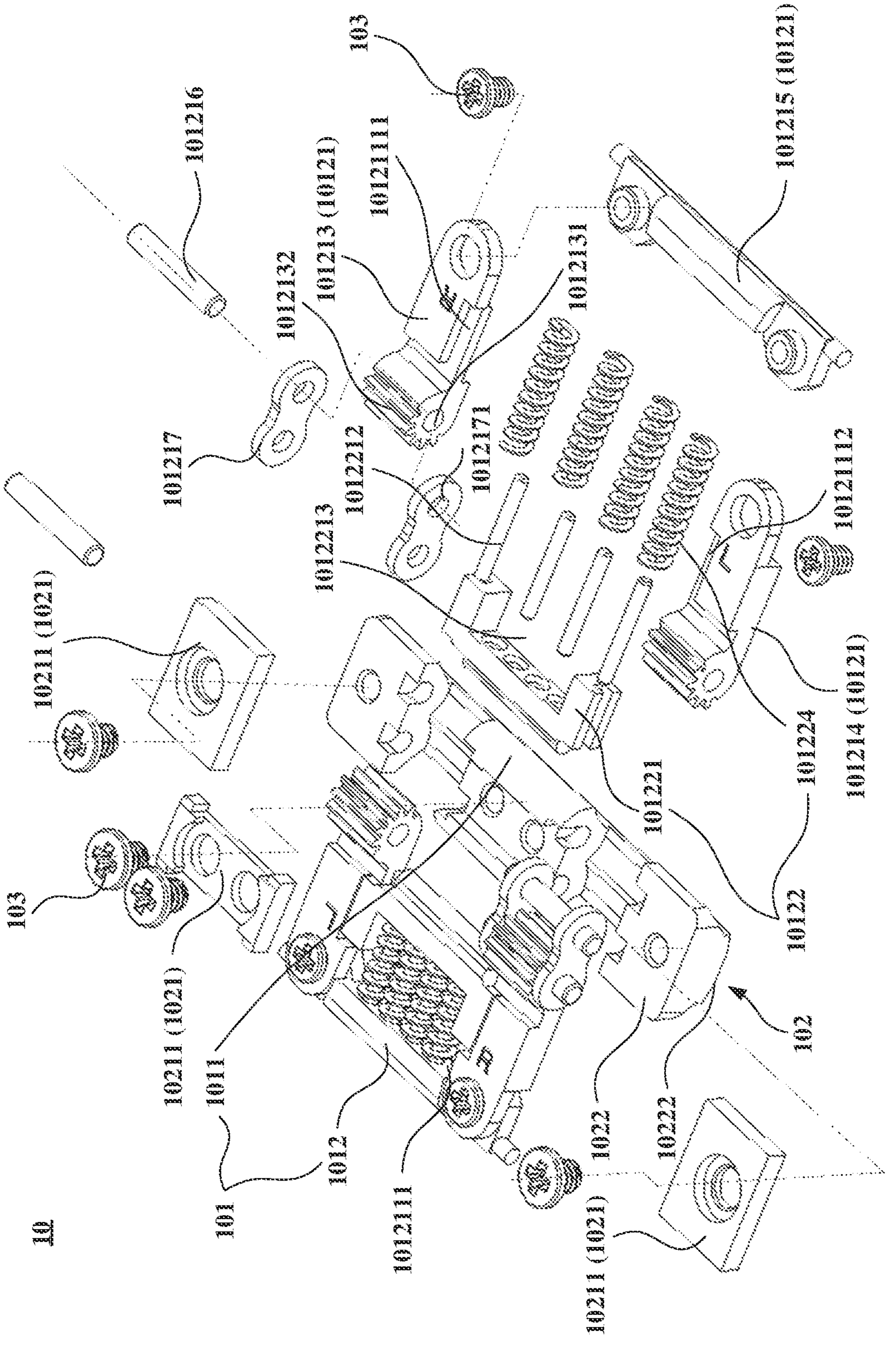
FIG. 14 is a schematic diagram of an exploded structure of a rotating shaft mechanism according to another embodiment of this disclosure.

FIG. 14 is an exploded diagram of a rotating shaft mechanism 10 according to another embodiment of this disclosure. In this embodiment, in specific disposing of the damper assembly 101, the damper assembly 101 may further include a cam member 1011 and a rotating assembly 1012. The cam member 1011 is fastened on a main shaft assembly 102 of the rotating shaft mechanism 10, and the cam member 1011 has a cam surface 10111. The rotating assembly 1012 includes a rotating member 10121 and a sliding member 10122, and the rotating member 10121 may rotate around the main shaft assembly 102, to drive the entire rotating assembly 1012 to rotate around the main shaft assembly 102. In a specific implementation, the rotating member 10121 includes a first rotating arm 101213, a second rotating arm 101214, and a connecting arm 101215. The first rotating arm 101213 and the second rotating arm 101214 are disposed opposite to each other, and each are rotatably connected to the main shaft assembly 102. In a possible embodiment, a structure of the first rotating arm 101213 and a structure of the second rotating arm 101214 may be the same.

In addition, an end portion that is of the first rotating arm 101213 and that faces away from the main shaft assembly 102 is fixedly connected to an end portion that is of the second rotating arm 101214 and that faces away from the main shaft assembly 102 by using the connecting arm 101215, so that the rotating member 10121 forms an integral frame structure. In addition, the first rotating arm 101213 and the second rotating arm 101214 may be fixedly connected to the connecting arm 101215 by using a fastener 103 such as a screw or a bolt. This constitutes no limitation.

Still refer to FIG. 14. After being connected to the connecting arm 101215, the first rotating arm 101213 and the second rotating arm 101214 may enclose a sliding groove 1012111. In a frame structure formed after the first rotating arm 101213 and the second rotating arm 101214 are connected to the connecting arm 101215, a part configured to enclose the sliding groove 1012111 may be used as a body portion of the rotating member 10121, and an end portion of the first rotating arm 101213 and an end portion of the second rotating arm 101214 that are configured to be rotatably connected to the main shaft assembly 102 may be used as a connecting portion of the rotating member 10121. The sliding member 10122 may be mounted in the sliding groove 1012111, and may slide in the sliding groove 1012111. In addition, one end of the sliding member 10122 may abut against the cam surface 10111 of the cam member 1011. It can be understood that an abutting force between the sliding member 10122 and the cam member 1011 may be transformed into a damping force of the damper assembly 101 and output to an outside.

In specific disposing of the sliding member 10122, the sliding member 10122 includes a sliding block 101221, the sliding block 101221 is accommodated in the sliding groove 1012111 and may slide in the sliding groove 1012111. In various embodiments of this disclosure, the specific shape of the sliding block 101221 is not limited. For example, the sliding block 101221 may be of a regular shape such as a rectangle or a trapezoid, or may be of an irregular shape.

Figure 15:
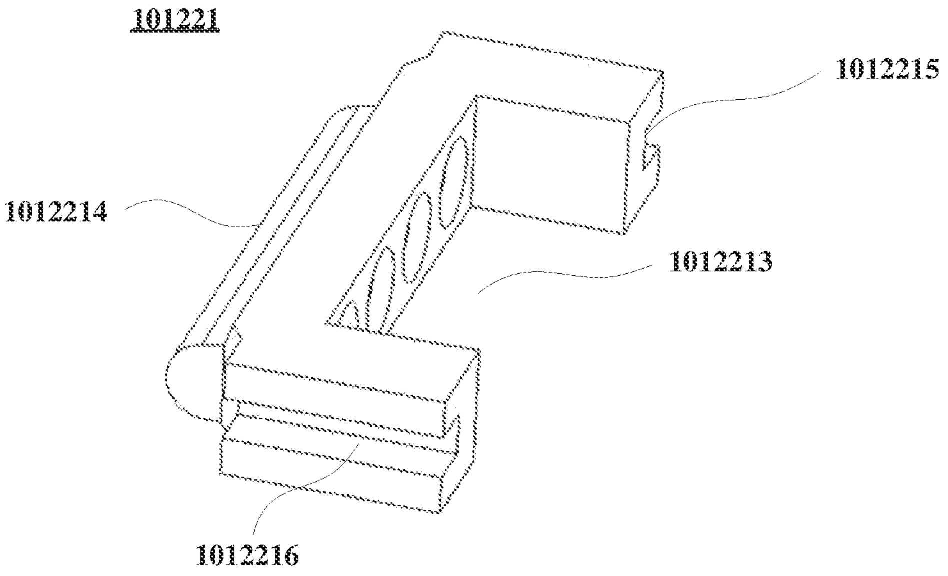
FIG. 15 is a schematic diagram of a structure of a sliding block according to another embodiment of this disclosure.

FIG. 15 shows a structure of a sliding block 101221 according to an embodiment. Refer to both FIG. 14 and FIG. 15. In this embodiment, an abutting portion 1012214 may be disposed on a side that is of the sliding block 101221 and that faces the main shaft assembly 102, and the abutting portion 1012214 may be configured to abut against the cam surface 10111 of the cam member 1011. A surface of the abutting portion 1012214 may be an arc surface or a spherical surface, so that a friction pair between the sliding block 101221 and the cam member 1011 is a rolling friction pair, to reduce wear of the sliding member 10122. In addition, the sliding block 101221 may be of an integral structure. In this case, the abutting portion 1012214 is a part of the sliding block 101221, to simplify a structure of the sliding member 10122. In some embodiments, the abutting portion 1012214 and the sliding block 101221 may alternatively be of a split structure. In this case, the abutting portion 1012214 and the sliding block 101221 may be fastened through threading, snap-fitting, or the like. In some other embodiments, the abutting portion 1012214 may alternatively be disposed as the roller in the foregoing embodiment, and the roller is rotatably connected to the sliding block by using the roller shaft.

Still refer to FIG. 14. In an embodiment of this disclosure, a first sliding portion 10121111 and a second sliding portion 10121112 are respectively disposed on two opposite groove walls of the sliding groove 1012111, so that the sliding block 101221 stably slides in the sliding groove 1012111. In a specific implementation, the first sliding portion 10121111 may be disposed on a side that is of the first rotating arm 101213 and that faces the sliding groove 1012111, and the second sliding portion 10121112 may be disposed on a side that is of the second rotating arm 101214 and that faces the sliding groove 1012111. In addition, refer to both FIG. 14 and FIG. 15. A third sliding portion 1012215 is disposed on a side that is of the sliding block 101221 and that faces the first rotating arm 101213, and a fourth sliding portion 1012216 is disposed on a side that is of the sliding block 101221 and that faces the second rotating arm 101214. The third sliding portion 1012215 slidably cooperates with the first sliding portion 10121111, and the fourth sliding portion 1012216 slidably cooperates with the second sliding portion 10121112.

The first sliding portion 10121111, the second sliding portion 10121112, the third sliding portion 1012215, and the fourth sliding portion 1012216 may be specifically disposed in a plurality of manners. For example, the first sliding portion 10121111 and the second sliding portion 10121112 may be disposed as grooves, and the third sliding portion 1012215 and the fourth sliding portion 1012216 may be disposed as protrusions; or the first sliding portion 10121111 and the second sliding portion 10121112 may be disposed as protrusions, and the third sliding portion 1012215 and the fourth sliding portion 1012216 may be disposed as grooves; or the first sliding portion 10121111 and the fourth sliding portion 1012216 may be disposed as grooves, and the second sliding portion 10121112 and the third sliding portion 1012215 may be disposed as protrusions, provided that two sliding portions on a same side slidably cooperate.

Refer to FIG. 14. In this embodiment of this disclosure, the sliding block 101221 may be further connected to an elastic element 101224, to implement reciprocal motion of the sliding member 10122 in the sliding groove 1012111 in a direction toward and away from the main shaft assembly 102. In addition, when the elastic element 101224 is a spring, a guide rod 1012212 may be further disposed on a side that is of the sliding block 101221 and that faces away from the main shaft assembly 102. In this way, the elastic element 101224 can be sleeved on the guide rod 1012212. In this embodiment, a hollow region 1012213 may be further disposed on a side that is of the sliding block 101221 and that faces away from the main shaft assembly 102, and the guide rod 1012212 and the elastic element 101224 may be disposed in the hollow region 1012213. For specific disposing manners of the elastic element 101224, the guide rod 1012212, and the hollow region 1012213, refer to the foregoing embodiment. Details are not described herein again.

It should be noted that in the embodiment shown in FIG. 15, the sliding block 101221 may be of an integral structure. In this case, the hollow region 1012213 may be a groove disposed on the sliding block 101221. In addition, the third sliding portion 1012215 and the fourth sliding portion 1012216 are also a part of the sliding block 101221. When the sliding block 101221 is of a split structure, the hollow region 1012213 may be a region formed by fixedly connecting a plurality of stoppers that form the sliding block 101221, and the third sliding portion 1012215 and the fourth sliding portion 1012216 each may be formed on a stopper on a corresponding side.

Still refer to FIG. 14. In an embodiment of this disclosure, one end that is of the first rotating arm 101213 and that is close to the main shaft assembly 102 may be rotatably connected to the main shaft assembly 102 by using a first rotating shaft 101216, so that the rotating member 10121 and the main shaft assembly 102 are rotatably connected. In a specific implementation, one end that is of the first rotating arm 101213 and that is close to the main shaft assembly 102 may be provided with a first through hole 1012131, the first rotating shaft 101216 penetrates through the first through hole 1012131, and two ends of the first rotating shaft 101216 are mounted on the main shaft assembly 102. An axis direction of the first rotating shaft 101216 is the same as the length direction of the main shaft assembly 102, the first rotating shaft 101216 may be fastened on the main shaft assembly 102, and the first rotating arm 101213 may rotate around the rotating shaft. In another embodiment, the first rotating arm 101213 may alternatively be fixedly connected to the first rotating shaft 101216, and the first rotating shaft 101216 may be rotatably connected to the main shaft assembly 102 after being mounted on the main shaft assembly 102, so that the first rotating arm 101213 and the main shaft assembly 102 are rotatably connected. For a rotatable connection between the second rotating arm 101214 and the main shaft assembly 102, refer to a side of the first rotating arm 101213. Details are not described herein again. It should be noted that, the first rotating arm 101213 and the second rotating arm 101214 each may be rotatably connected to the main shaft assembly 102 by using one first rotating shaft 101216, or may share one first rotating shaft 101216, to simplify the structure of the rotating shaft mechanism 10.

It can be understood that, in this embodiment, the first rotating arm 101213 and the second rotating arm 101214 are rotatably connected to the main shaft assembly 102 by using the first rotating shaft 101216, so that the rotating member 10121 is rotatably connected to the main shaft assembly 102 by using a solid shaft. In some other embodiments of this disclosure, the rotating member 10121 and the main shaft assembly 102 may alternatively be rotatably connected by using a virtual shaft, to implement the miniaturization design of the rotating shaft mechanism 10.

In this embodiment, there may also be a plurality of damper assemblies 101, and the plurality of damper assemblies 101 are separately disposed on two sides that are of the main shaft assembly 102 and that are perpendicular to the length direction of the main shaft assembly 102. There may be a same quantity of damper assemblies 101 located on each of the two sides of the main shaft assembly 102. In this way, the damper assemblies 101 can provide almost a same damping force for two housings of the terminal device, to help improve the structural stability of the terminal device.

In addition, when there is a same quantity of damper assemblies 101 located on each of the two sides of the main shaft assembly 102, damper assemblies 101 on the two sides of the main shaft assembly 102 may be disposed in a one-to-one correspondence or disposed in a staggered manner. In a possible embodiment of this disclosure, damper assemblies 101 may alternatively be disposed in pairs, and two damper assemblies 101 disposed in pairs are separately disposed on the two sides that are of the main shaft assembly 102 and that are perpendicular to the length direction of the main shaft assembly 102.

Refer to FIG. 14. In an embodiment of this disclosure, an end portion that is of the first rotating arm 101213 and that is configured to be rotatably connected to the main shaft assembly 102 may be further provided with a gear structure 1012132, and the gear structure 1012132 may be an independent structure and is fixedly connected to the first rotating arm 101213. Alternatively, the gear structure 1012132 may be directly formed on a surface of the end portion of the first rotating arm 101213, to simplify a structure of the first rotating arm 101213. One end that is of the second rotating arm 101214 and that is configured to be rotatably connected to a main shaft may also be provided with the gear structure 1012132. For a specific disposing manner, refer to the first rotating arm 101213. Details are not described herein again. In this way, a gear structure 1012132 of a first rotating arm 101213 of one of the two damper assemblies 101 disposed in pairs can engage with a gear structure 1012132 of a second rotating arm 101214 of the other damper assembly 101. In this disclosure, the structure of the first rotating arm 101213 and the structure of the second rotating arm 101214 may be the same. Therefore, in some possible embodiments, a gear structure 1012132 of a first rotating arm 101213 of one of the two damper assemblies 101 disposed in pairs may engage with a gear structure 1012132 of a first rotating arm 101213 of the other damper assembly 101. Similarly, a gear structure 1012132 of a second rotating arm 101214 of one of the two damper assemblies 101 disposed in pairs may engage with a gear structure 1012132 of a first rotating arm 101213 or a second rotating arm 101214 on a corresponding side of the other damper assembly 101. In this case, the two damper assemblies 101 disposed in pairs synchronously rotate through engagement between gear structures 1012132 of rotating arms on a corresponding side.

Figure 16:
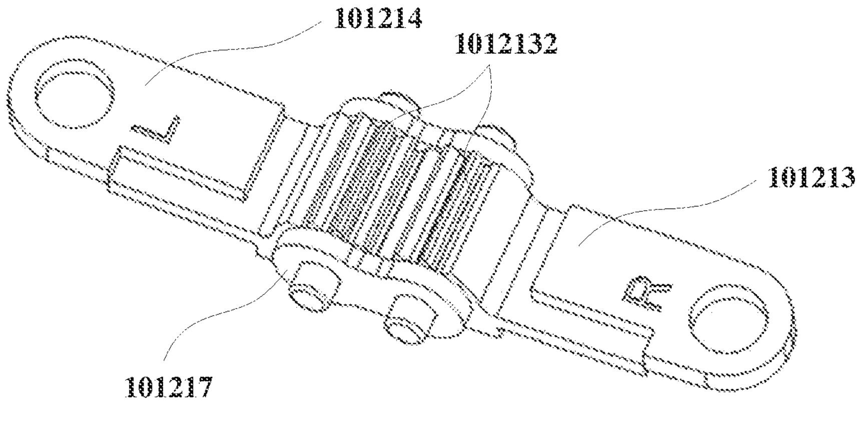
FIG. 16 is a schematic diagram of a connection relationship between a first rotating arm and a second rotating arm that engage with each other according to another embodiment of this disclosure.

Refer to both FIG. 14 and FIG. 16. FIG. 16 shows a connection relationship between a first rotating arm 101213 and a second rotating arm 101214 of two damper assemblies 101. In a process in which one of the damper assemblies 101 rotates around the main shaft assembly 102, the other damper assembly 101 may be driven to move in a direction that is opposite or faces away, so that the two damper assemblies 101 synchronously rotate. This helps improve consistency of damping forces on the two sides of the rotating shaft mechanism 10, to improve the structural stability of the rotating shaft mechanism 10.

Still refer to FIG. 14 and FIG. 16. One baffle plate 101217 may be disposed on each of two sides of the first rotating arm 101213 and the second rotating arm 101214 that engage with each other and in the length direction of the main shaft assembly 102, to improve reliability of a transmission relationship between the first rotating arm 101213 and the second rotating arm 101214 that engage with each other. The two baffle plates 101217 may be configured to limit motion of the gear structure 1012132 of the first rotating arm 101213 and motion of the gear structure 1012132 of the second rotating arm 101214 in the length direction of the main shaft assembly 102, so that an engagement length between the gear structure 1012132 of the first rotating arm 101213 and the gear structure 1012132 of the second rotating arm 101214 is long, to improve stability of motion transfer between the gear structure 1012132 of the first rotating arm 101213 and the gear structure 1012132 of the second rotating arm 101214. In addition, each baffle plate 101217 is further provided with a second through hole 1012171, so that a first rotating shaft 101216 of each rotating arm can pass through a corresponding second through hole 1012171 in a one-to-one correspondence, to limit a center distance between the two gear structures 1012132, and help improve reliability of motion transfer between the two gear structures 1012132.

In specific disposing of the main shaft assembly 102 in this embodiment of this disclosure, refer to FIG. 14. The main shaft assembly 102 may include a main outer shaft 1021 and a main inner shaft 1022, to adapt to a structural design of the damper assembly 101. The main inner shaft 1022 has a first surface 10222 configured to support the flexible display 40. In a possible embodiment of this disclosure, the first surface 10222 may be an arc surface. In this way, when the flexible display 40 shown in FIG. 1 is folded, the first surface 10222 may be configured to support the flexible display 40. In addition, a radian of the first surface 10222 may be designed based on a bending radian of a bending part of the flexible display 40, to reduce a risk that the flexible display 40 is damaged when being pressed or pulled.

Figure 17:
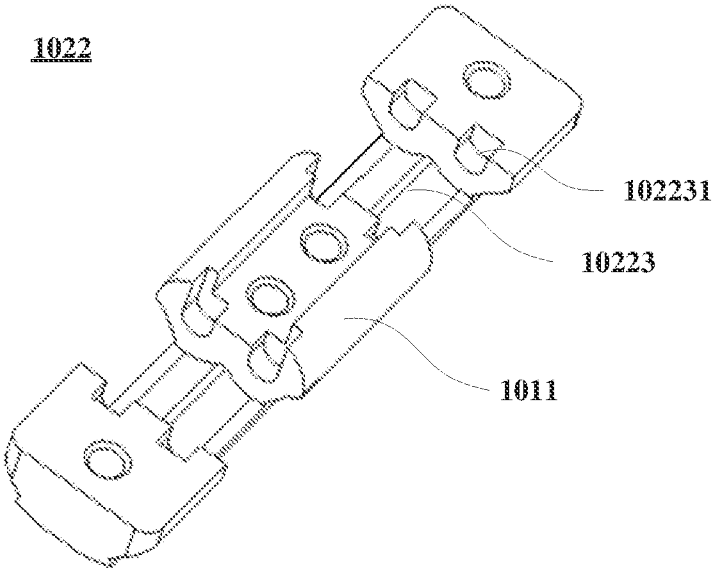
FIG. 17 is a schematic diagram of a structure of a main inner shaft according to another embodiment of this disclosure.

FIG. 17 shows a structure of a main inner shaft according to another embodiment of this disclosure. The cam member 1011 of the rotating assembly 1012 mentioned in the foregoing embodiment may be fastened on the main inner shaft 1022. In some possible embodiments of this disclosure, the cam member 1011 and the main inner shaft 1022 may alternatively be of an integral structure, to simplify the structure of the rotating shaft mechanism 10, and improve the structural stability of the rotating shaft mechanism 10.

The main inner shaft 1022 is provided with an opening groove 10223. In the embodiment shown in FIG. 14, an end portion of the first rotating arm 101213 and an end portion of the second rotating arm 101214 that are configured to be rotatably connected to the main shaft assembly 102 are mounted in corresponding opening grooves 10223. In addition, a groove wall of the opening groove 10223 in the length direction of the main shaft assembly 102 may be provided with a shaft hole 102231, the shaft hole 102231 may be but is not limited to a U-shaped hole, and two ends of the first rotating shaft 101216 of the first rotating arm 101213 and the second rotating arm 101214 may be mounted in one shaft hole 102231 in a one-to-one correspondence.

Refer to FIG. 14. The main outer shaft 1021 may be fastened to the main inner shaft 1022, and accommodation space for accommodating another component of the rotating shaft mechanism 10 may be enclosed between the main outer shaft 1021 and the main inner shaft 1022. In addition, after the main outer shaft 1021 and the main inner shaft 1022 are fastened, the main outer shaft 1021 and the main inner shaft 1022 may be connected by using a fastener 103 such as a bolt or a screw, or may be fixedly connected by using a snap-fit. This constitutes no limitation.

In an embodiment of this disclosure, the main outer shaft 1021 may be disposed to be of a split structure, to prevent the first rotating shaft 101216 of the first rotating arm 101213 and the second rotating arm 101214 from falling off from the corresponding shaft hole 102231. In this case, the main outer shaft 1021 includes a plurality of mutually independent pressure caps 10211, and the pressure caps 10211 covers an opening of the shaft hole 102231, so that an end portion of the first rotating shaft 101216 is limited between the shaft hole 102231 and the pressure caps 10211. In addition, each pressure cap 10211 may be fixedly connected to the main inner shaft 1022 by using a fastener 103 such as a bolt or a screw, or by using a snap-fit, or the like. This constitutes no limitation.

Figure 18:
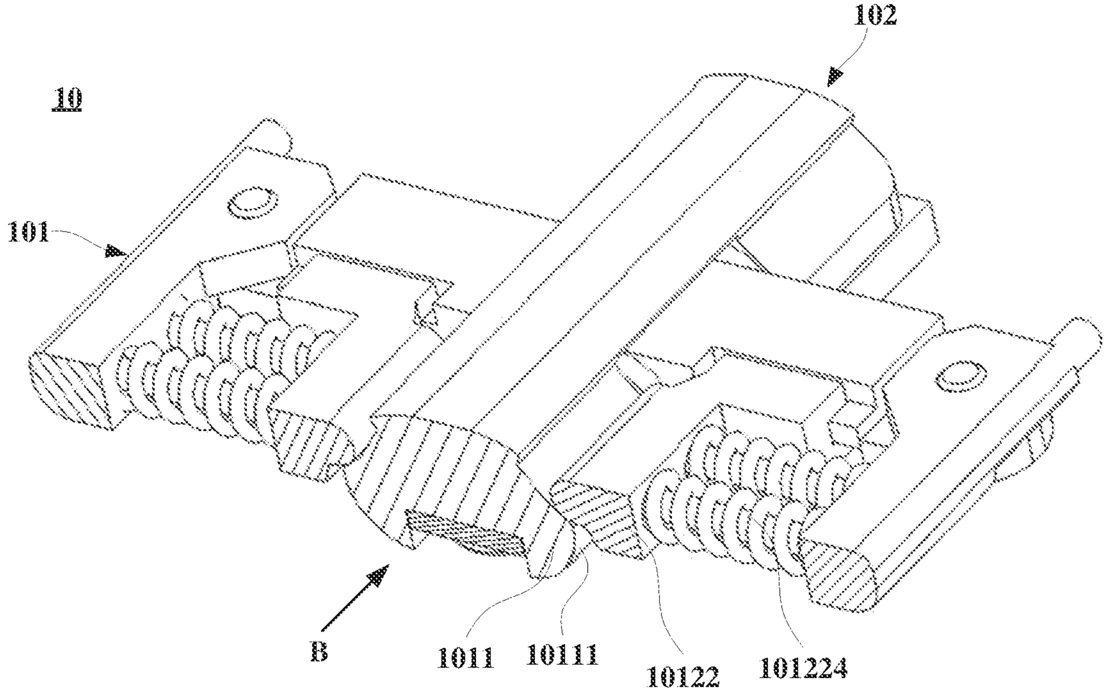
FIG. 18 is a schematic diagram of a partial structure of a rotating shaft mechanism according to another embodiment of this disclosure.

FIG. 18 is a schematic diagram of a partial structure of a rotating shaft mechanism 10 according to an embodiment of this disclosure. The rotating shaft mechanism 10 shown in FIG. 18 is in an unfolded state. In the unfolded state, the sliding member 10122 elastically abuts against the cam surface 10111 of the cam member 1011 under an elastic force of the elastic element 101224. An abutting force formed through elastic abutting may be transformed into resistance of relative rotation of the cam member 1011 and the rotating assembly 1012, to generate the damping force between the main shaft assembly 102 and the damper assembly 101. In this way, the rotating shaft mechanism 10 can be maintained in the unfolded state, to provide enough support for the terminal device.

Figure 19A:
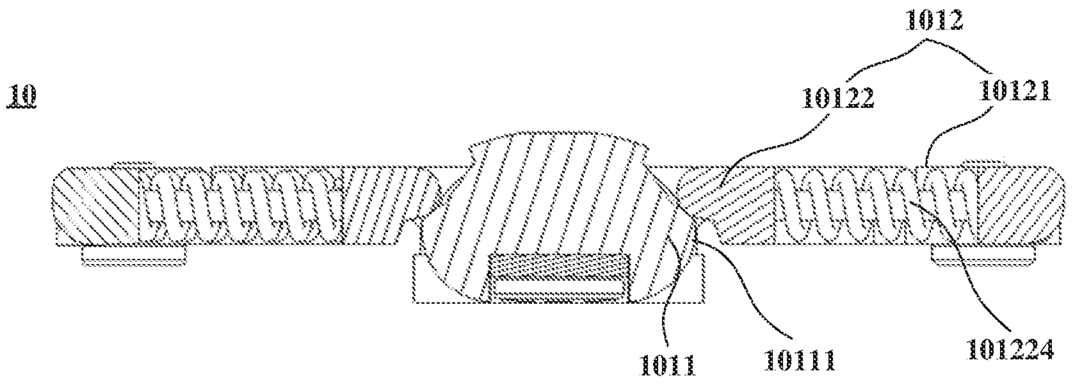
FIG. 19*a* to FIG. 19*c* are sectional views of a rotating shaft mechanism at different folding degrees according to another embodiment of this disclosure.

In addition, FIG. 19*a* is a B-direction view of the rotating shaft mechanism 10 in FIG. 18. The unfolded state is a common use state of the terminal device, in this state, the rotating shaft mechanism 10 needs to provide a large damping force to maintain flatness of the entire device.

Figure 19B:
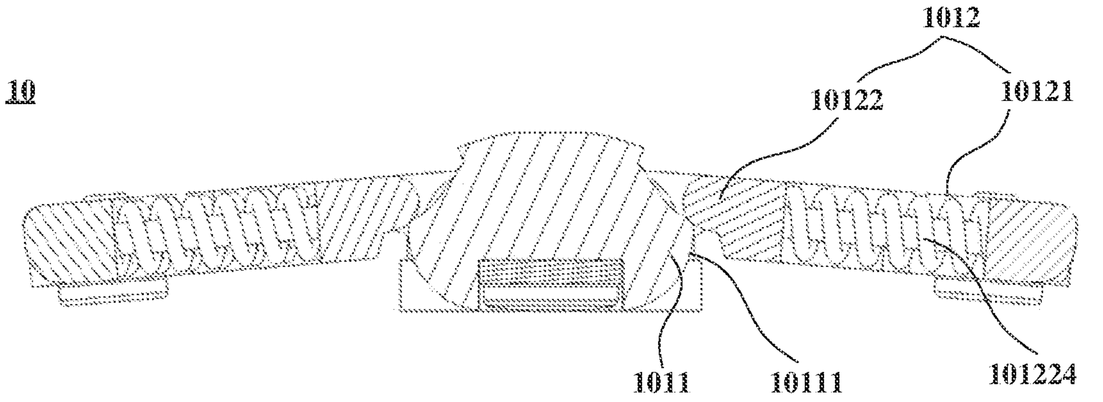
Figure 19C:
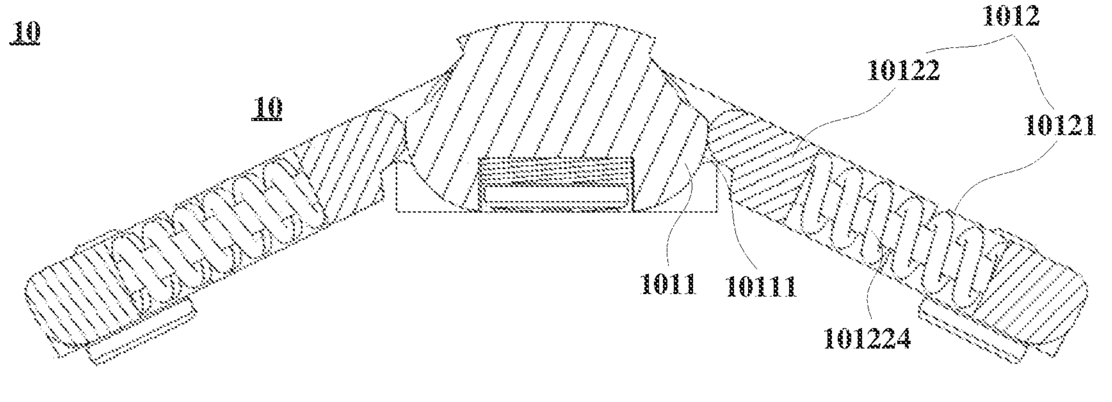

FIG. 19*a* to FIG. 19*c* are schematic diagrams of structures of a rotating shaft mechanism 10 at different folding degrees. It can be found, in comparison of the rotating shaft mechanism 10 at different folding degrees, that, when the rotating shaft mechanism 10 is at different folding degrees, the elastic element 101224 is compressed or stretched to different degrees, and therefore, stores different elastic forces, so that the rotating assembly 1012 is subject to different damping forces in a process in which the rotating assembly 1012 rotates relative to the cam member 1011, to achieve a variable damping effect of the rotating shaft mechanism 10.

Figure 20:
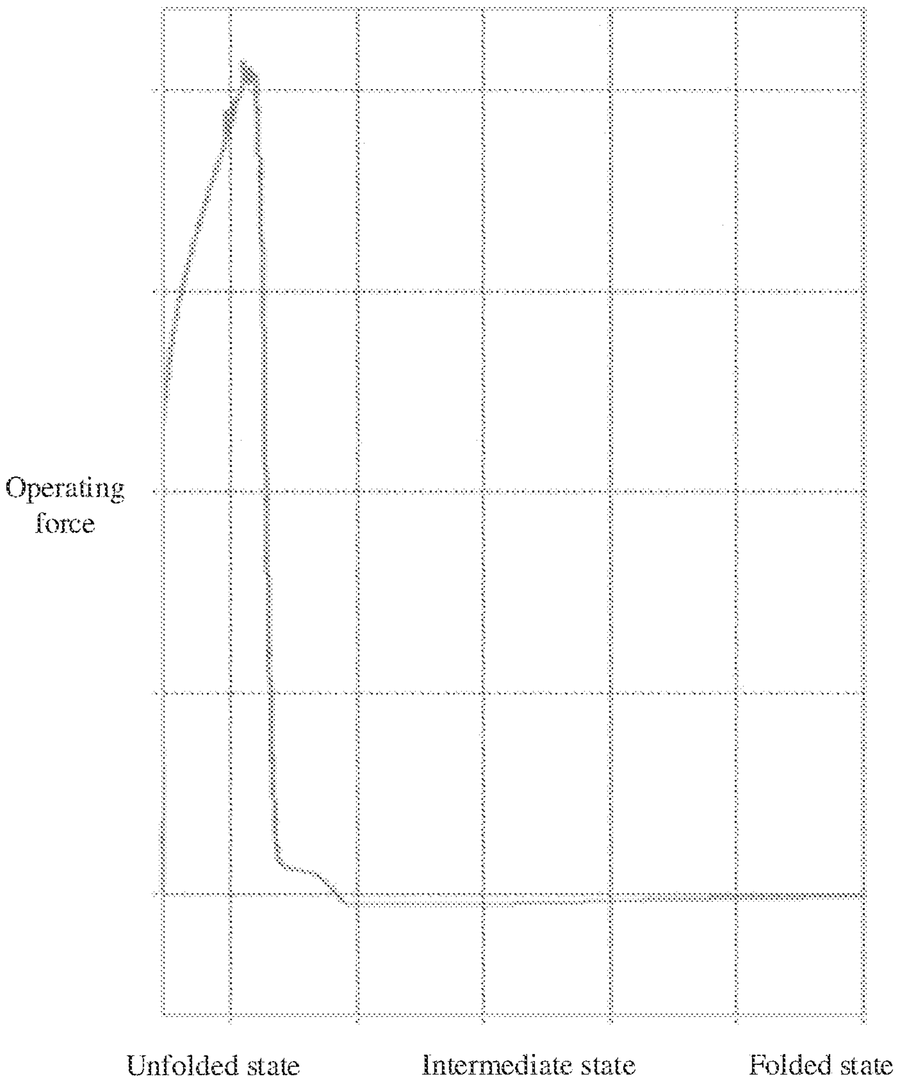
FIG. 20 is a schematic diagram of an operating force in a process in which a rotating shaft mechanism is switched from an unfolded state to a folded state according to an embodiment of this disclosure.

It can be understood from the descriptions of the rotating shaft mechanism 10 that, a specific form of a contour curve of the cam surface 10111 that forms the cam member 1011 may be designed based on operating forces required by the rotating shaft mechanism 10 at different folding degrees. FIG. 20 is a schematic diagram of an operating force in a process in which a rotating shaft mechanism 10 is switched from an unfolded state to a folded state according to an embodiment of this disclosure. It can be understood that, in FIG. 20, a horizontal coordinate represents a process of switching from an unfolded state to a folded state, and a vertical coordinate represents a magnitude of the operating force.

The unfolded state is a common use state of the terminal device, in this state, the rotating shaft mechanism 10 needs to provide a large damping force to maintain flatness of the entire device. When the terminal device is folded from the unfolded state, the rotating member 10121 rotates around the main shaft assembly 102, and the sliding member 10122 moves along the cam surface 10111 of the cam member 1011 and compresses the elastic element 101224 under an action of the cam member 1011. Therefore, the elastic force of the elastic element 101224 and the specific form of the cam surface 10111 are properly designed, to effectively improve a comfort degree of folding operation experience of the terminal device, and further ensure a life of the damper assembly.

Figure 21A:
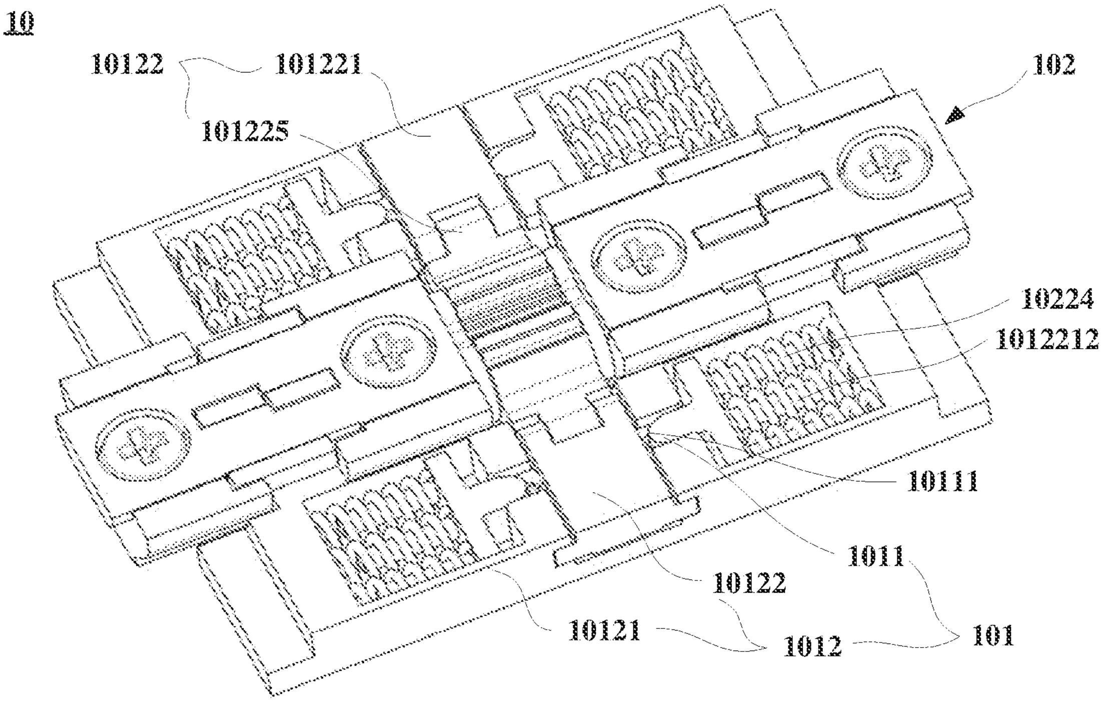
FIG. 21*a* is a schematic diagram of a structure of a rotating shaft mechanism in an unfolding state according to another embodiment of this disclosure.
Figure 21B:
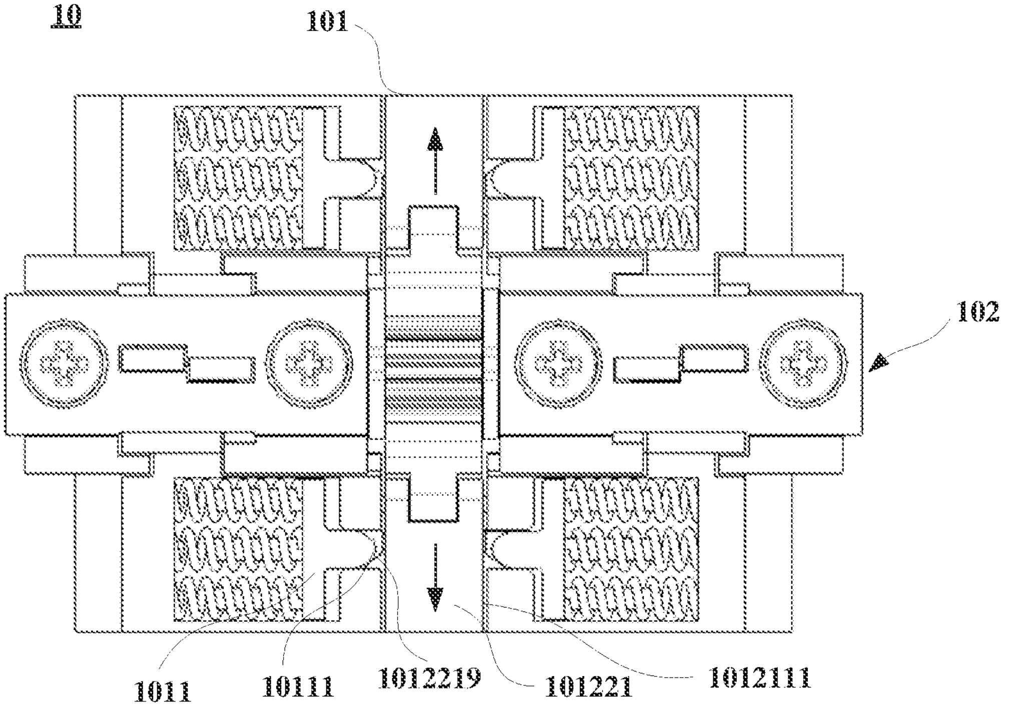
FIG. 21*b* is a schematic diagram of a structure existing when the rotating shaft mechanism in FIG. 21*a* is viewed from another perspective.
Figure 21C:
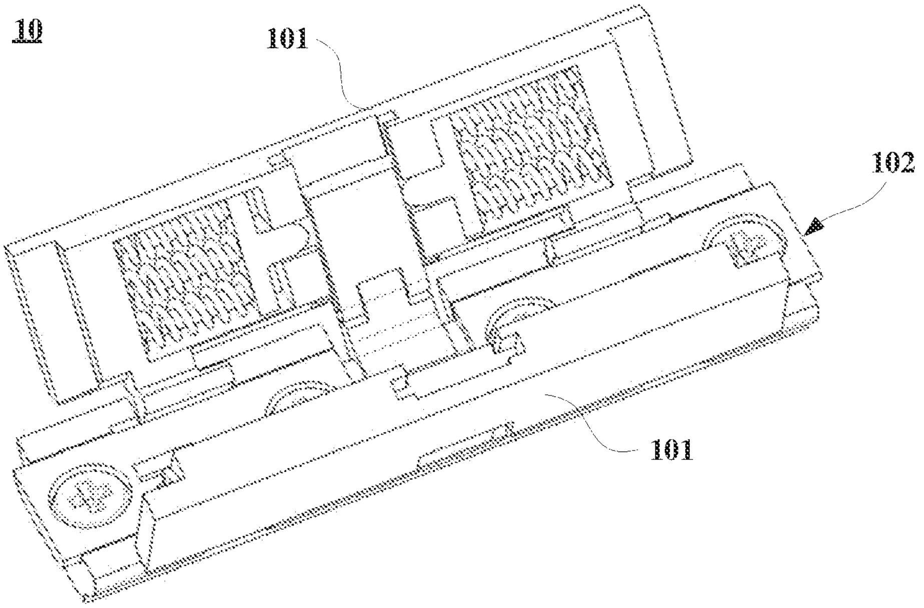
FIG. 21*c* is a schematic diagram of a structure of a rotating shaft mechanism in an intermediate state according to an embodiment of this disclosure.

The rotating shaft mechanism 10 in this disclosure may be disposed in another possible manner in addition to the manner provided in the foregoing embodiment. For example, refer to FIG. 21*a* and FIG. 21*b*. FIG. 21*a* is a schematic diagram of a structure of a rotating shaft mechanism 10 according to still another embodiment of this disclosure. FIG. 21*b* is a schematic diagram of a structure existing when the rotating shaft mechanism 10 in FIG. 21*a* is viewed from another perspective. In the embodiment shown in FIG. 21*a* and FIG. 21*b*, the rotating shaft mechanism 10 is in an unfolded state. In addition, further refer to FIG. 21*c*. FIG. 21*c* is a schematic diagram of a structure of a rotating shaft mechanism 10 in an intermediate state. In this embodiment of this disclosure, the rotating shaft mechanism 10 may also include a main shaft assembly 102 and a damper assembly 101, and the damper assembly 101 is rotatably connected to the main shaft assembly 102. There may be a plurality of damper assemblies 101, and the plurality of damper assemblies 101 are separately disposed on two sides that are of the main shaft assembly 102 and that are perpendicular to a length direction of the main shaft assembly 102, to generate a damping force that meets a requirement on the two sides of the rotating shaft mechanism 10.

Figure 22:
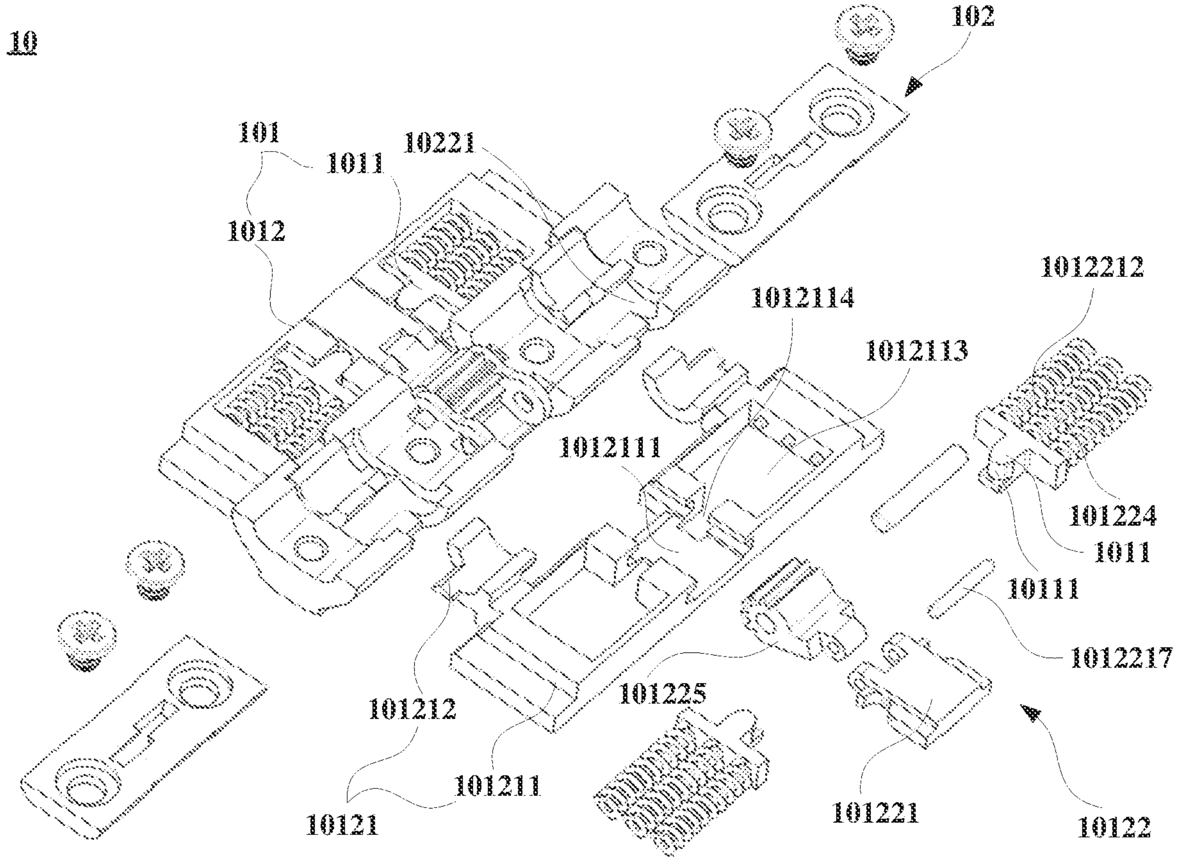
FIG. 22 is a schematic diagram of an exploded structure of a rotating shaft mechanism according to another embodiment of this disclosure.
Figure 23:
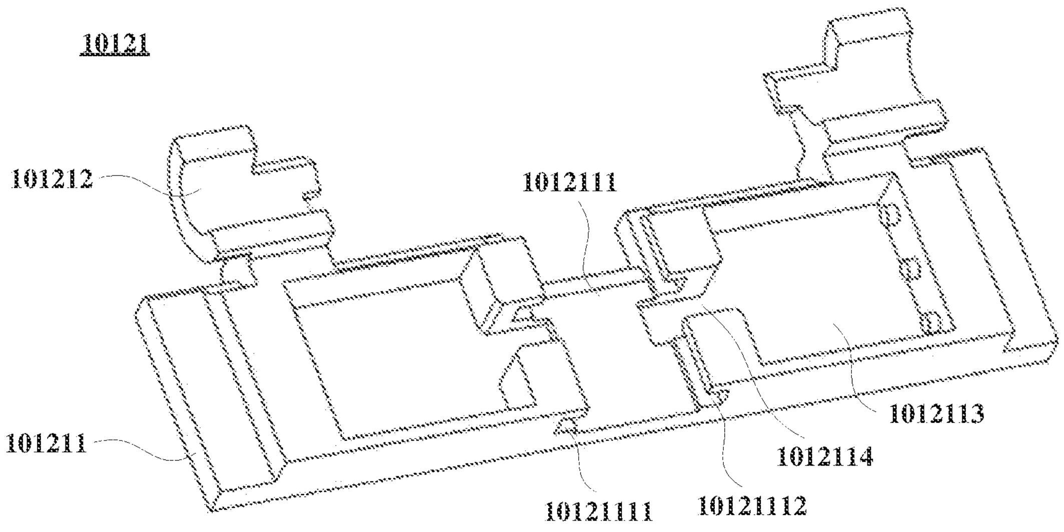
FIG. 23 is a schematic diagram of a structure of a rotating member according to another embodiment of this disclosure.

FIG. 22 is a schematic diagram of an exploded structure of the rotating shaft mechanism shown in FIG. 21*a* to FIG. 21*c*. In specific disposing of the damper assembly 101, the damper assembly 101 may further include a rotating assembly 1012 and a cam member 1011. The rotating assembly 1012 includes a rotating member 10121 and a sliding member 10122, and the rotating member 10121 may rotate around the main shaft assembly 102, to drive the entire rotating assembly 1012 to rotate around the main shaft assembly 102. In a specific implementation, refer to both FIG. 22 and FIG. 23. FIG. 23 shows a structure of a rotating member 10121. The rotating member 10121 may include a body portion 101211 and a connecting portion 101212, the connecting portion 101212 is disposed on one side of the body portion 101211, and the connecting portion 101212 is fixedly connected to the body portion 101211. It can be understood that, in the embodiment shown in FIG. 23, the rotating member 10121 may be of an integral structure, so that structural reliability of the rotating member 10121 can be effectively improved, to improve motion stability of the rotating member 10121. In some other embodiments of this disclosure, the rotating member 10121 may alternatively be of a split structure, and the body portion 101211 and the connecting portion 101212 may be fixedly connected by using a fastener 103 such as a bolt, so that a structure of the rotating member 10121 can be flexibly set.

The connecting portion 101212 may be configured to be rotatably connected to the main shaft assembly 102 in FIG. 22. In the embodiment shown in FIG. 23, the connecting portion 101212 may be disposed as an arc shaft. There may be a plurality of arc shafts, to improve reliability of connecting the connecting portion 101212 and the main shaft assembly 102. In addition, as shown in FIG. 22, the main shaft assembly 102 may be provided with an arc groove 10221, and the arc groove 10221 and the arc shaft are disposed in a one-to-one correspondence. In this way, each arc shaft may be accommodated in a corresponding arc groove 10221, and an arc surface of the arc shaft may slide along a groove wall of the arc groove 10221, to implement relative rotation of the connecting portion 101212 and the main shaft assembly 102. It can be understood that, in this embodiment, the arc shaft and the arc groove 10221 slidably cooperate, to form a virtual shaft, so that the rotating member 10121 and the main shaft assembly 102 are rotatably connected by using the virtual shaft. In this way, a structure for rotatably connecting the rotating member 10121 and the main shaft assembly 102 can occupy small space of the main shaft assembly 102, to help implement miniaturization and a thin design of the rotating shaft mechanism 10. In some other possible embodiments of this disclosure, the rotating member 10121 and the main shaft assembly 102 may alternatively be rotatably connected by using a solid shaft, to effectively simplify the structure of the rotating shaft mechanism 10, and reduce management and control difficulty of a manufacturing process of the rotating shaft mechanism 10.

Still as shown in FIG. 23, the body portion 101211 of the rotating member 10121 in this embodiment is also provided with a sliding groove 1012111. As shown in both FIG. 22 and FIG. 23, at least a part of the sliding member 10122 is accommodated in the sliding groove 1012111 and may slide in the sliding groove 1012111. In a process in which the sliding member 10122 slides in the sliding groove 1012111, an end portion of the sliding member 10122 may abut against a cam surface 10111 of the cam member 1011, and an abutting force generated when the end portion abuts against the cam surface 10111 may be transformed into a damping force output of the damper assembly 101 for output.

In addition, different from the foregoing embodiments, in this embodiment, the cam member 1011 is disposed on the rotating assembly 1012. In a specific implementation, refer to FIG. 23. The body portion 101211 of the rotating member 10121 is further provided with two mounting grooves 1012113. In the length direction of the main shaft assembly 102, the two mounting grooves 1012113 are respectively located on two sides of the sliding groove 1012111. In addition, each mounting groove 1012113 may be connected to the sliding groove 1012111 through a via hole 1012114.

Figure 24:
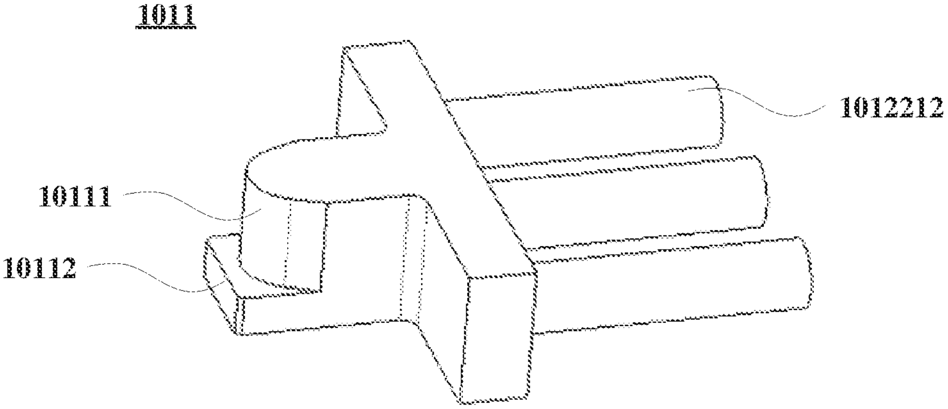
FIG. 24 is a schematic diagram of a structure of a cam member according to another embodiment of this disclosure.

Still as shown in FIG. 22, the cam member 1011 may be mounted in the mounting groove 1012113. In addition, FIG. 24 is a schematic diagram of a structure of a cam member 1011 according to an embodiment of this disclosure. One end that is of the cam member 1011 and that is provided with the cam surface 10111 may extend into the via hole 1012114, and may move in the mounting groove 1012113 in a direction toward or away from the sliding groove 1012111. Still as shown in FIG. 22, in an embodiment of this disclosure, the cam member 1011 is further connected to an elastic element 101224, and the elastic element 101224 may apply, to the cam member 1011, an elastic force toward the sliding groove 1012111, to press the cam member 1011 toward the sliding member 10122. The elastic element 101224 may be disposed with reference to any one of the foregoing embodiments. Details are not described herein again.

In the embodiment shown in FIG. 22, the elastic element 101224 is a spring, a guide rod 1012212 is disposed on a side that is of the cam member 1011 and that faces away from the via hole 1012114, and the elastic element 101224 may be sleeved on the guide rod 1012212, to facilitate mounting of the elastic element 101224 and the cam member 1011, and further avoid a problem that arching, or the like occurs when the elastic element 101224 is elastically deformed. Therefore, reliability of sliding the cam member 1011 in the mounting groove 1012113 is improved. In addition, one end of the elastic element 101224 elastically abuts against a groove wall of the mounting groove 1012113, and the other end elastically abuts against the cam member 1011, to press the cam member 1011 toward the sliding groove 1012111.

In this embodiment of this disclosure, in specific disposing of the sliding member 10122, as shown in FIG. 22, the sliding member 10122 may include a rotating portion 101225 and a sliding block 101221. The sliding block 101221 is rotatably connected to the rotating portion 101225, and the rotating portion 101225 is rotatably connected to the main shaft assembly 102. In addition, an extension direction of an axis around which the rotating portion 101225 rotates around the main shaft assembly 102 is the same as the length direction of the main shaft assembly 102. However, an axis around which the rotating portion 101225 rotates around the main shaft assembly 102 is parallel to but does not overlap an axis around which the connecting portion 101212 of the rotating member 10121 rotates around the main shaft assembly 102. In this way, in a process in which the rotating assembly 1012 rotates relative to the main shaft assembly 102, there may be a phase difference between the sliding member 10122 and the rotating member 10121, so that the sliding member 10122 may slide relative to the rotating member 10121.

Figure 25:
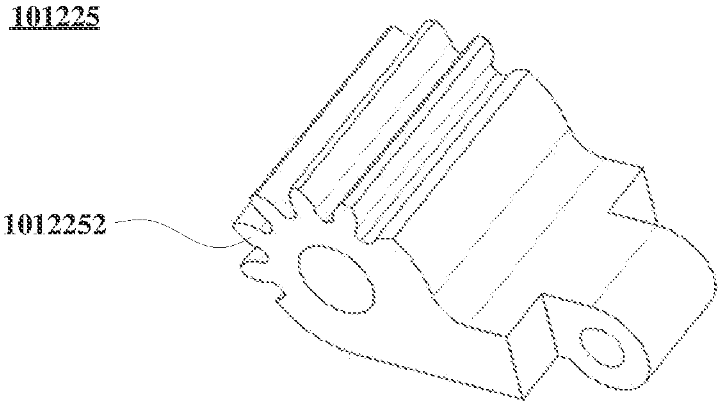
FIG. 25 is a schematic diagram of a structure of a rotating portion according to another embodiment of this disclosure.

FIG. 25 shows a structure of a rotating portion 101225 according to an embodiment of this disclosure. In this embodiment, the rotating portion 101225 may be provided with a gear structure 1012252, and the gear structure 1012252 may be an independent structure and is fixedly connected to the rotating portion 101225. Alternatively, the gear structure 1012252 may be directly formed on a surface of an end portion of the rotating portion 101225, to simplify the structure of the rotating portion 101225. Gear structures 1012252 of rotating portions 101225 of two damper assemblies 101 in FIG. 22 that are disposed in pairs may engage with each other. In this case, in a process in which one of the damper assemblies 101 rotates around the main shaft assembly 102, the other damper assembly 101 may be driven to move in a direction that is opposite or faces away, so that the two damper assemblies 101 synchronously rotate. This helps improve consistency of damping forces on the two sides of the rotating shaft mechanism 10, to improve the structural stability of the rotating shaft mechanism 10.

Figure 26:
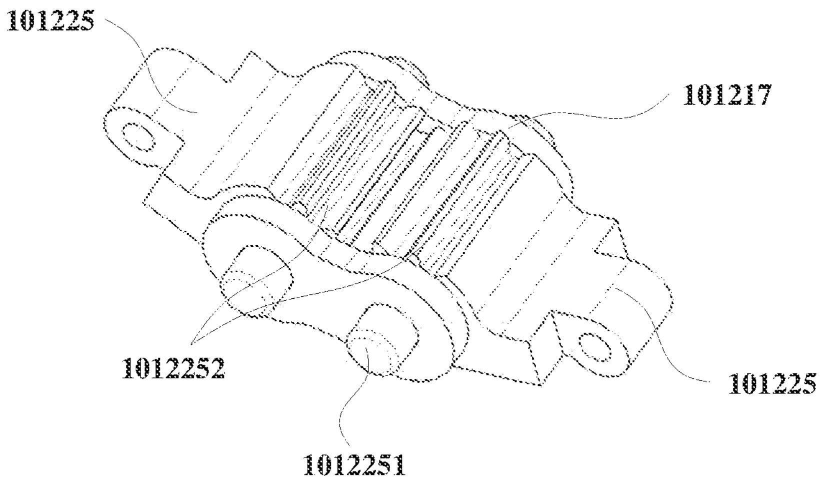
FIG. 26 is a schematic diagram of an exploded structure of two rotating portions that engage with each other according to another embodiment of this disclosure.
Figure 27:
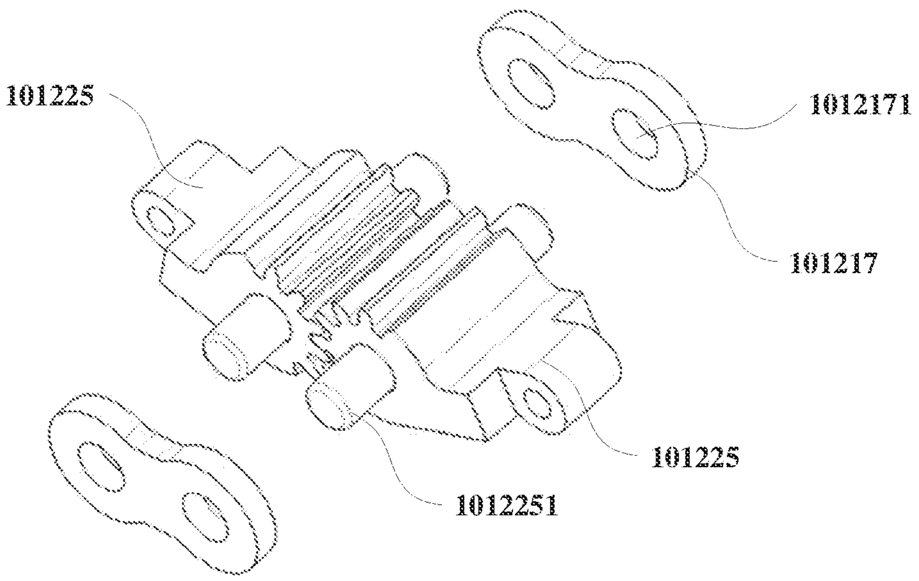
FIG. 27 is a schematic diagram of a connection relationship between two rotating portions that engage with each other according to another embodiment of this disclosure.

FIG. 26 is a diagram of a connection relationship between two rotating portions 101225 according to this disclosure. FIG. 27 is an exploded diagram of a connection relationship between two rotating portions 101225 according to this disclosure. As shown in FIG. 26, one baffle plate 101217 may be disposed on each of two sides of two rotating portions 101225 that engage with each other and in the length direction of the main shaft assembly 102 shown in FIG. 22, to improve reliability of a transmission relationship between the two rotating portions 101225 that engage with each other. The two baffle plates 101217 may be configured to limit motion, of gear structures 1012252 of the two rotating portions 101225 that engage with each other, in the length direction of the main shaft assembly 102, so that an engagement length between the gear structures 1012252 of the two rotating portions 101225 is long, to improve reliability of motion transfer between the gear structures 1012252 of the two rotating portions 101225. In addition, as shown in FIG. 27, each baffle plate 101217 is further provided with a second through hole 1012171, so that a second rotating shaft 1012251 of each rotating portion 101225 can pass through a corresponding second through hole 1012171, to limit a center distance between the two gear structures 1012252 that engage with each other, and help improve reliability of motion of the two gear structures 1012252.

Figure 28:
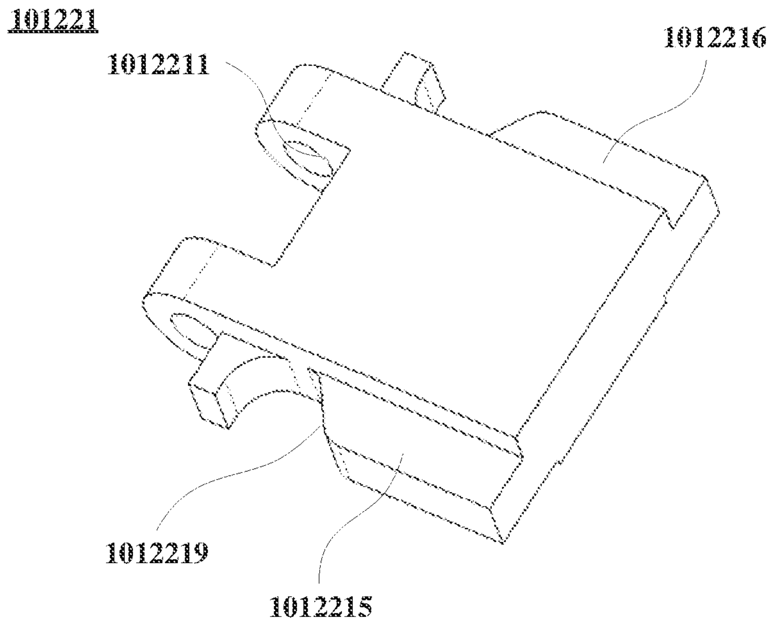
FIG. 28 is a schematic diagram of a structure of a sliding block according to another embodiment of this disclosure.

The sliding block 101221 may be rotatably connected to the rotating portion 101225 by using a third rotating shaft 1012217. FIG. 28 shows a structure of the sliding block 101221 according to a possible embodiment of this disclosure. One end portion of the sliding block 101221 may be provided with a mounting hole 1012211, and two end portions of the third rotating shaft 1012217 each are mounted in one mounting hole 1012211. In addition, an end portion of the sliding block 101221 is provided with a concave portion, and the mounting hole 1012211 is disposed on a side face of the concave portion. In this case, a part of the rotating portion 101225 may extend into the concave portion, so that the rotating portion 101225 is rotatably connected to the sliding block 101221. In this way, a structure including the sliding block 101221 and the rotating portion 101225 may be compact, to help implement a miniaturization design of the rotating shaft mechanism 10.

It can be learned from the foregoing descriptions of a sliding principle of the sliding member 10122 and the rotating member 10121 in this embodiment of this disclosure that, in this embodiment of this disclosure, at least a part of the sliding block 101221 may be accommodated in the sliding groove 1012111 of the rotating member 10121 and may slide in the sliding groove 1012111. In addition, as shown in FIG. 23, a first sliding portion 10121111 and a second sliding portion 10121112 may be respectively disposed on two opposite groove walls of the sliding groove 1012111. In addition, as shown in FIG. 28, a third sliding portion 1012215 and a fourth sliding portion 1012216 are disposed on the sliding block 101221. The third sliding portion 1012215 slidably cooperates with the first sliding portion 10121111, and the fourth sliding portion 1012216 slidably cooperates with the second sliding portion 10121112.

The first sliding portion 10121111, the second sliding portion 10121112, the third sliding portion 1012215, and the fourth sliding portion 1012216 may be specifically disposed in a plurality of manners. For example, the first sliding portion 10121111 and the second sliding portion 10121112 may be disposed as grooves, and the third sliding portion 1012215 and the fourth sliding portion 1012216 may be disposed as protrusions; or the first sliding portion 10121111 and the second sliding portion 10121112 may be disposed as protrusions, and the third sliding portion 1012215 and the fourth sliding portion 1012216 may be disposed as grooves; or the first sliding portion 10121111 and the fourth sliding portion 1012216 may be disposed as grooves, and the second sliding portion 10121112 and the third sliding portion 1012215 may be disposed as protrusions, provided that two sliding portions on a same side slidably cooperate.

It can be learned from the foregoing description of the cam member 1011 that the cam member 1011 is mounted in the mounting groove 1012113, and the cam member 1011 may extend into the via hole 1012114 and may move in the mounting groove 1012113 in a direction toward or away from the sliding groove 1012111. Still as shown in FIG. 28, in this disclosure, an end portion that is of the sliding block 101221 and that faces the cam member 1011 may be further provided with an inclined surface 1012219. As shown in both FIG. 22 and FIG. 28, the cam surface 10111 of the cam member 1011 abuts against the inclined surface 1012219, to apply a pushing force to the sliding block 101221 in a direction away from the main shaft assembly 102. It can be understood that, the cam surface 10111 and the inclined surface 1012219 are properly designed, to adjust a damping force provided by the damper assembly 101.

Still as shown in FIG. 28, when the third sliding portion 1012215 and the fourth sliding portion 1012216 of the sliding block 101221 are disposed as protrusions, the inclined surface 1012219 may be a surface of a concave portion disposed on the protrusion. In addition, in a possible embodiment of this disclosure, the cam member 1011 in FIG. 24 may be further provided with a boss 10112. The sliding block 101221 may limit motion of the boss 10112 in a direction toward a groove opening of the mounting groove 1012113 of the rotating member 10121, to limit the cam member 1011 in the mounting groove 1012113, and prevent the cam member 1011 from falling off from the mounting groove 1012113. In a specific implementation, the third sliding portion 1012215 and the fourth sliding portion 1012216 of the sliding block 101221 may be disposed as protrusions, and a protrusion on a corresponding side is located at a location that is on the boss 10112 and that is close to the groove opening of the mounting groove 1012113, to limit the boss 10112.

Figure 29:
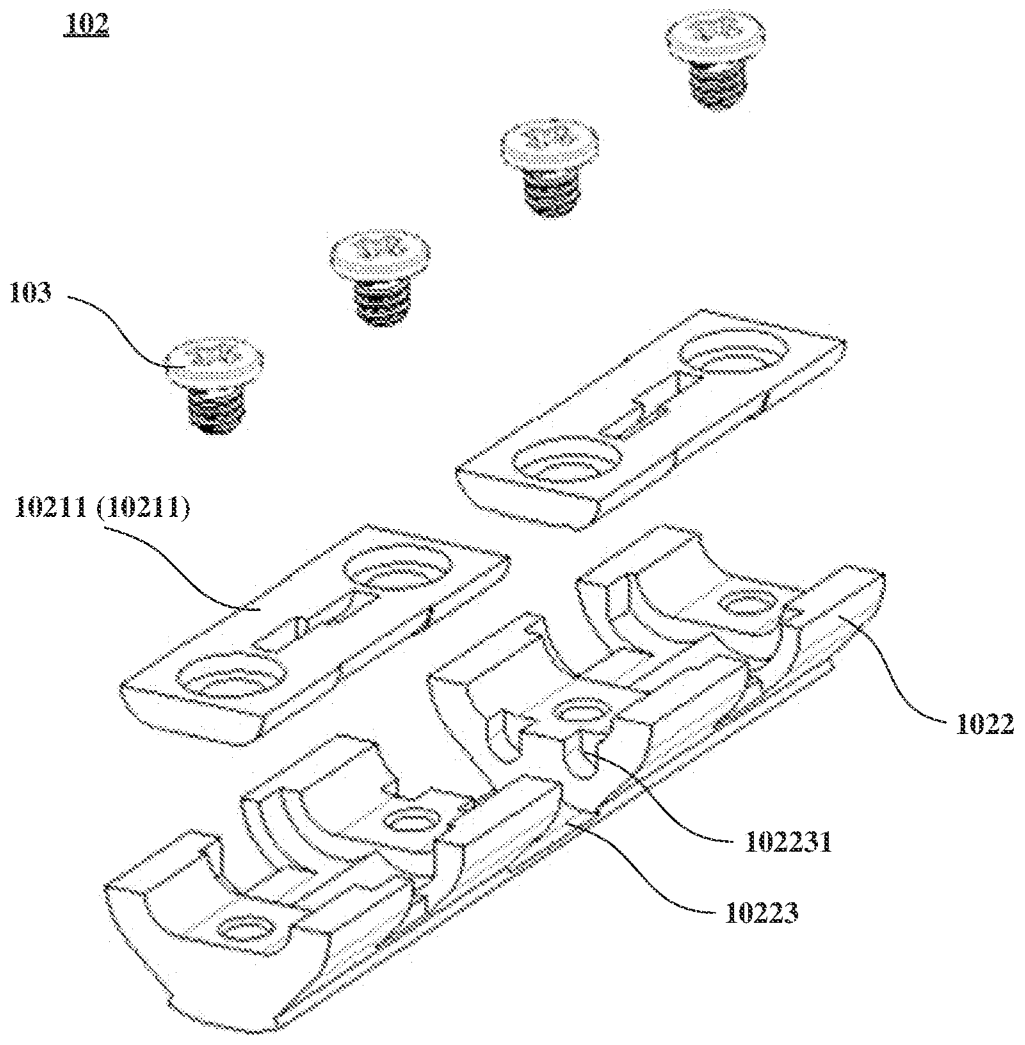
FIG. 29 is a schematic diagram of an exploded structure of a main shaft assembly according to another embodiment of this disclosure.
Figure 30:
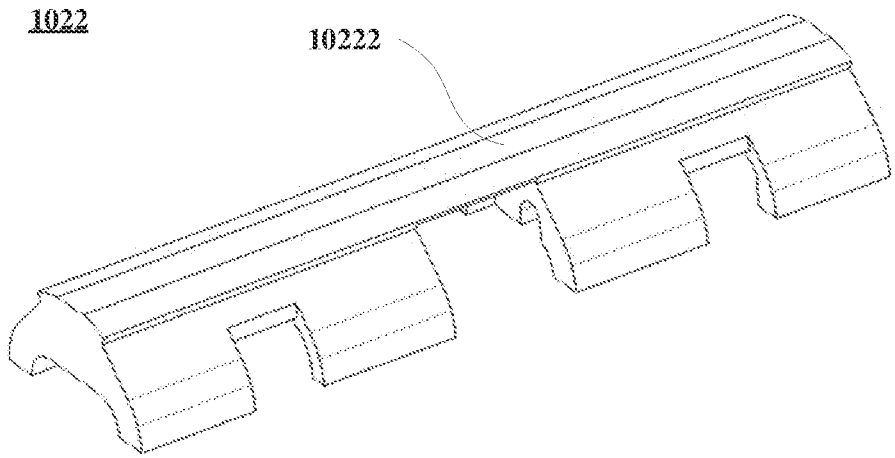
FIG. 30 is a schematic diagram of a structure of a main inner shaft according to another embodiment of this disclosure.

FIG. 29 is a schematic diagram of a structure of a main shaft assembly 102 according to an embodiment of this disclosure. In this embodiment, the main shaft assembly 102 further includes a main inner shaft 1022 and a main outer shaft 1021. FIG. 30 is a schematic diagram of a structure of a main inner shaft 1022 according to an embodiment. Similar to the foregoing embodiments, the main inner shaft 1022 in this embodiment also has a first surface 10222 configured to support the flexible display 40. The first surface 10222 may be disposed with reference to the foregoing embodiments. Details are not described herein again.

Still as shown in FIG. 29, the main inner shaft 1022 is provided with an opening groove 10223, and the rotating portion 101225 of the sliding member 10122 may be mounted in the opening groove 10223. In addition, a groove wall of the opening groove 10223 in the length direction of the main shaft assembly 102 may be provided with a shaft hole 102231, and the shaft hole 102231 may be but is not limited to a U-shaped hole. Two ends of the second rotating shaft 1012251 of the rotating portion 101225 shown in FIG. 27 may be mounted in a corresponding shaft hole 102231.

The main outer shaft 1021 may be fastened to the main inner shaft 1022, and accommodation space for accommodating another component of the rotating shaft mechanism 10 may be enclosed between the main outer shaft 1021 and the main inner shaft 1022. In addition, after the main outer shaft 1021 and the main inner shaft 1022 are fastened, the main outer shaft 1021 and the main inner shaft 1022 may be connected by using a fastener such as a bolt or a screw, or may be fixedly connected by using a snap-fit. This constitutes no limitation.

Figure 31:
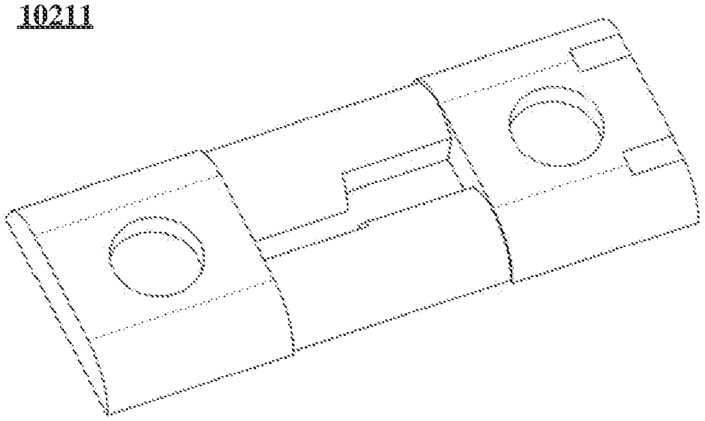
FIG. 31 is a schematic diagram of a structure of a pressure cap according to another embodiment of this disclosure.

Still as shown in FIG. 29, in an embodiment of this disclosure, the main outer shaft 1021 may be disposed to be of a split structure, to avoid interference in motion of the rotating portion 101225. In this case, the main outer shaft 1021 includes a plurality of mutually independent pressure caps 10211. FIG. 31 is a schematic diagram of a structure of a pressure cap 10211 according to an embodiment. A structure of the pressure cap 10211 may be but is not limited to a panel shape. Each pressure cap 10211 is fastened to the main outer shaft 1021, and accommodation space is formed between each pressure cap 10211 and the main outer shaft 1021. A connecting portion 101212 of the rotating member 10121 may be accommodated in the accommodation space, and is rotatably connected to the main shaft assembly 102.

Because the unfolded state is a common state of the rotating shaft mechanism 10, it can be understood from the descriptions of the specific structure of the rotating shaft mechanism 10 in the foregoing embodiments that, for the rotating shaft mechanism 10 in the unfolded state shown in FIG. 21*a* and FIG. 21*b*, the elastic element 101224 may push the cam member 1011 to press the sliding block 101221, so that the cam member 1011 elastically abuts against the sliding block 101221, and the elastic element 101224 is subject to a pushing force applied by the cam member 1011 in a direction away from the sliding block 101221. In this state, the cam surface 10111 of the cam member 1011 abuts against a location that is on the inclined surface 1012219 of the sliding block 101221 and that faces away from the via hole 1012114. A tilt angle of the inclined surface 1012219 is properly set, so that a pressing force from the cam member 1011 may be transformed into a pulling force applied to the sliding block 101221 in a direction away from the main shaft assembly 102 (a direction shown by an arrow in FIG. 21*b*), to generate a damping force between the main shaft assembly 102 and the damper assembly 101.

Figure 32A:
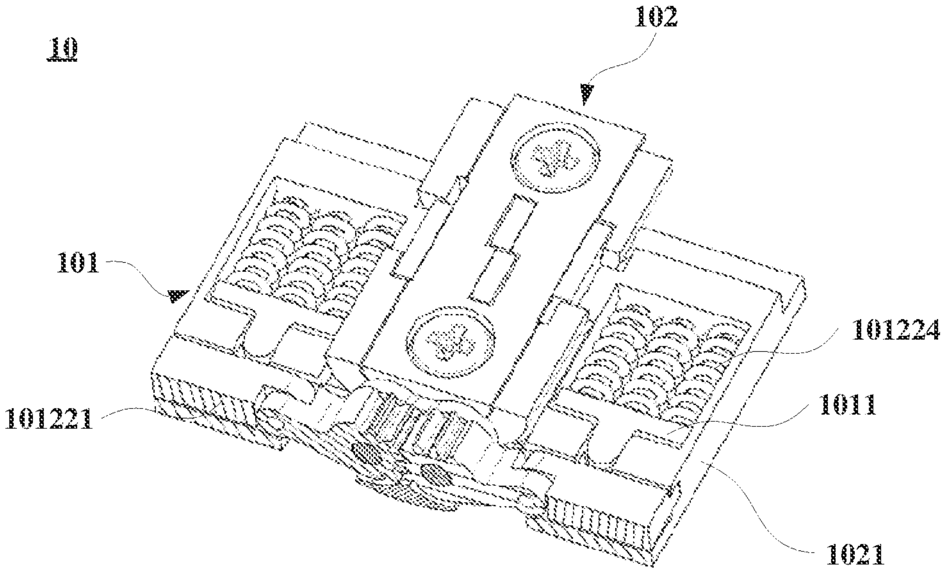
FIG. 32*a* to FIG. 32*c* are schematic diagrams of structures of a rotating shaft mechanism at different folding degrees according to another embodiment of this disclosure.

FIG. 32*a* shows a relative location relationship between a sliding block 101221 and a rotating member 10121 when a rotating shaft mechanism 10 is in an unfolded state according to an embodiment of this disclosure. When the rotating shaft mechanism 10 is folded, FIG. 32*b* and FIG. 32*c* each show a relative position relationship between a sliding block 101221 and a rotating member 10121 when a rotating shaft mechanism 10 is in an intermediate state at a different folding degree. It can be found, in comparison of the rotating shaft mechanism 10 at different folding degrees, that, in a process in which the rotating shaft mechanism 10 is switched from the unfolded state to a folded state, the sliding block 101221 slides in a direction close to the main shaft assembly 102 relative to the rotating member 10121; and in a process in which the rotating shaft mechanism 10 is switched from the folded state to the unfolded state, the sliding block 101221 slides in a direction away from the main shaft assembly 102 relative to the rotating member 10121. It can be learned that, when the rotating shaft mechanism 10 is in the unfolded state, a force exerted on the sliding block 101221 enables the sliding block 101221 to tend to slide in a direction away from the main shaft assembly 102, so that the entire rotating shaft mechanism 10 tends to rotate toward a side opposite to a folding direction of the rotating shaft mechanism 10. Usually, a rotation limiting structure is disposed between the rotating member 10121 and the main shaft assembly 102, and such a motion trend may enable the entire rotating shaft mechanism 10 to remain in the unfolded state even under a specific external force.

Figure 32B:
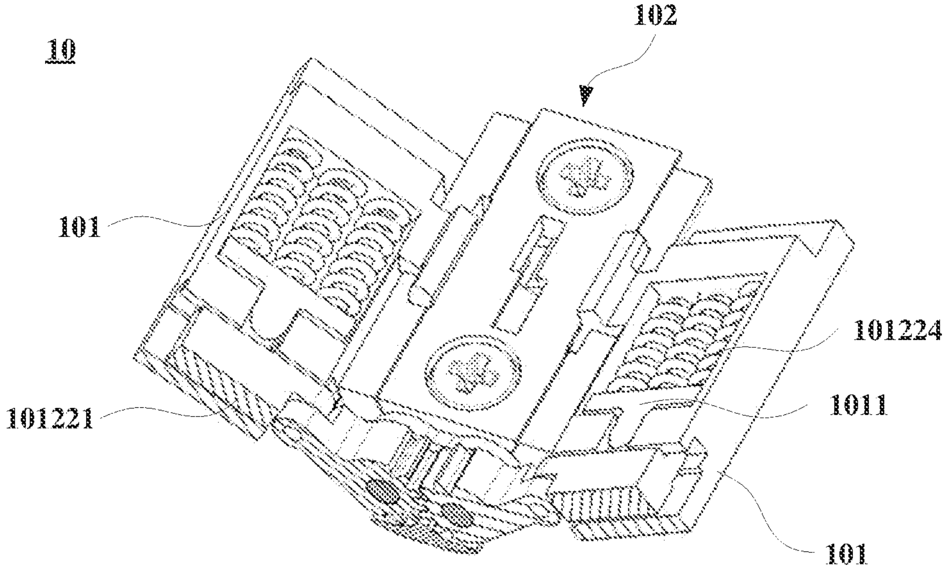
Figure 32C:
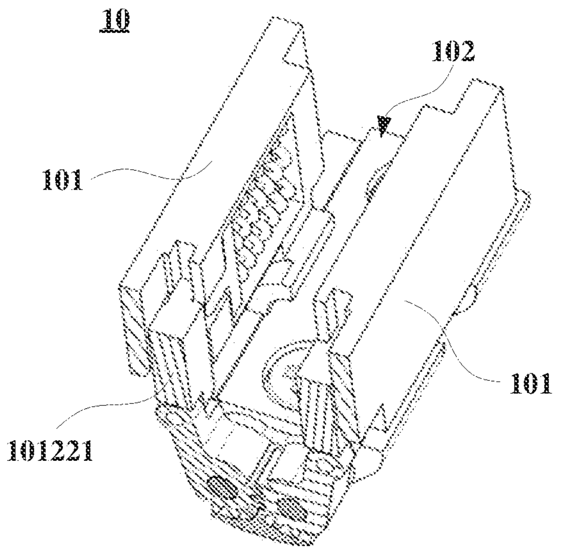

When the rotating shaft mechanism 10 needs to be folded, it can be learned from FIG. 32*b* and FIG. 32*c* that the sliding block 101221 needs to slide in a direction toward the main shaft assembly 102. It can be learned, from a cooperation relationship between the inclined surface 1012219 of the sliding block 101221 and the cam surface 10111 of the cam member in FIG. 21*b*, that, when the sliding block 101221 moves toward the main shaft assembly 102, the inclined surface 1012219 of the sliding block 101221 pushes the cam member to slide in a direction away from the sliding groove 1012111, to increase a compression amount of the elastic element 101224. In this process, from a perspective of the rotating shaft mechanism 10, the rotating shaft mechanism 10 is folded by overcoming the elastic force of the elastic element 101224. However, from an operation perspective of the rotating shaft mechanism 10, a large force needs to be applied to the rotating shaft mechanism 10, to fold the rotating shaft mechanism 10. In addition, it can be understood that, when the rotating shaft mechanism 10 is unfolded to be in a state close to an unfolded state, the cam member 1011 moves toward the sliding groove 1012111 along the inclined surface 1012219, and the elastic element 101224 releases the elastic force, to help, to some extent, unfold the rotating shaft mechanism 10. In this disclosure, an operating force that varies with the folding degree may also be referred to as an operation feel.

Figure 33:
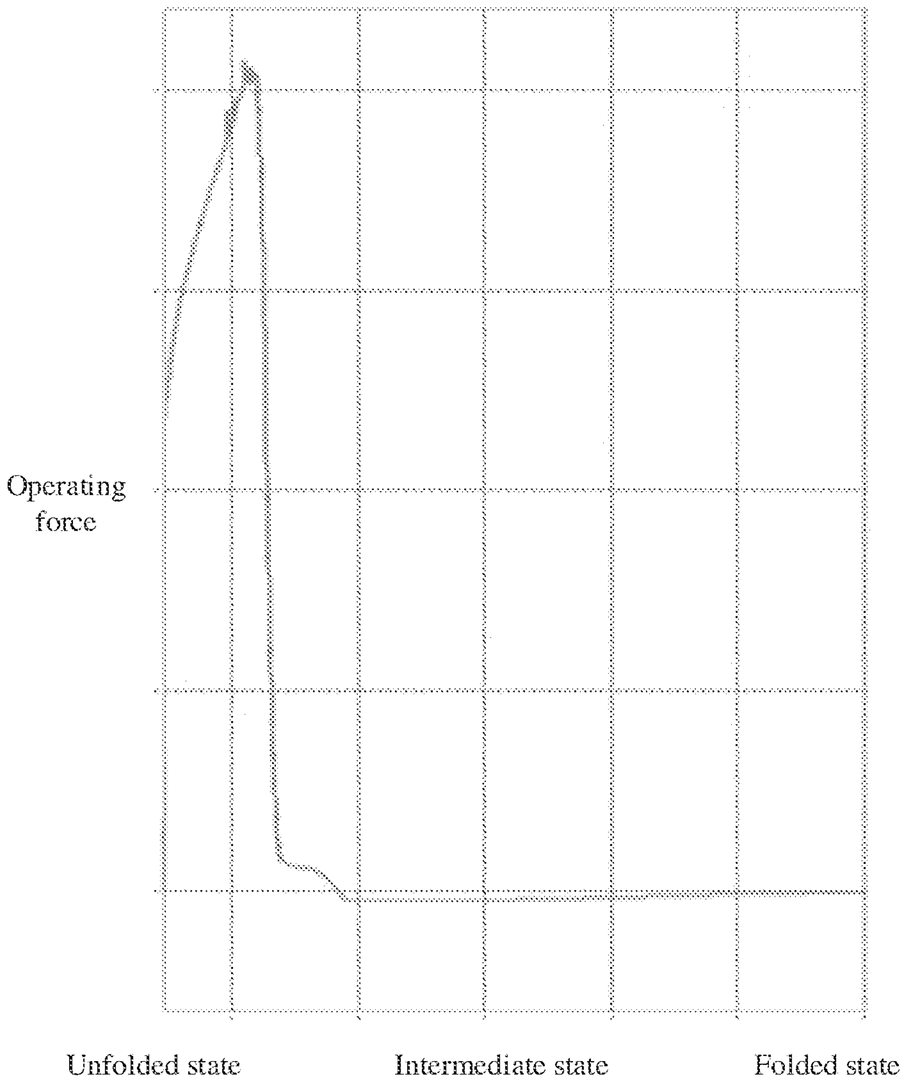
FIG. 33 is a schematic diagram of an operating force in a process in which a rotating shaft mechanism is switched from an unfolded state to a folded state according to another embodiment of this disclosure.

FIG. 33 is a schematic diagram of an operating force in a process in which a rotating shaft mechanism 10 is switched from an unfolded state to a folded state. Because the unfolded state is a common use state of the rotating shaft mechanism 10, the rotating shaft mechanism 10 needs to provide a large damping force to maintain flatness of the entire device. When the rotating shaft mechanism 10 is folded, as shown in FIG. 32*a* to FIG. 32*c*, the sliding block 101221 may slide, to push the cam member 1011 to press the elastic element 101224. In addition, as shown in FIG. 21*b*, in this embodiment of this disclosure, in a proper design, when the rotating shaft mechanism 10 reaches a specific folding degree, a contact surface of the cam surface 10111 of the cam member and the sliding block 101221 slides from the inclined surface to a planar region. In this way, an operating force for folding the rotating shaft mechanism 10 may be greatly reduced, and the rotating shaft mechanism 10 can be further folded by overcoming only friction inside the rotating shaft mechanism 10. In this way, a life of the damper assembly can be ensured.

It can be understood that, in the rotating shaft mechanism 10 provided in the foregoing embodiments of this disclosure, the damper assembly 101 may be integrated into another possible structure, for example, a structure configured to implement a direct connection between the rotating shaft mechanism 10 and a housing of a terminal device, to improve a structural integration degree of the rotating shaft mechanism 10, and meet a requirement for a miniaturization design of the rotating shaft mechanism 10. In addition, when space of the rotating shaft mechanism 10 is enough, disposing of the damper assembly 101 may not depend on disposing of another structure, to decoupling the damper assembly 101 and the another structure, so that the damper assembly 101 is disposed more flexibly.

In addition, when the rotating shaft mechanism 10 provided in this disclosure includes a plurality of damper assemblies 101, the plurality of damper assemblies 101 may be disposed in a same manner, and may be the damper assembly 101 mentioned in any one of the foregoing embodiments of this disclosure. In addition, the plurality of damper assemblies 101 may be disposed in different manners, and may be damper assemblies 101 mentioned in at least two of the foregoing embodiments of this disclosure.

It is clear that a person skilled in the art can make various modifications and variations to this disclosure without departing from the spirit and scope of this disclosure. This disclosure is intended to cover these modifications and variations of this disclosure provided that they fall within the scope of protection defined by the claims of this disclosure and their equivalent technologies.

What is claimed is:

1. A rotating shaft mechanism comprising: a main shaft assembly and a damper assembly, wherein:

the damper assembly is rotatably connected to the main shaft assembly;

the damper assembly comprises a cam member and a rotating assembly, the cam member is fixedly fastened on the main shaft assembly, the cam member has a cam surface, the rotating assembly comprises a rotating member and a sliding member, the rotating member is rotatably connected to the main shaft assembly, and the sliding member is configured to slide in a direction toward or away from the main shaft assembly relative to the rotating member; and the sliding member elastically abuts against the cam surface, to generate a damping force between the main shaft assembly and the damper assembly.

2. The rotating shaft mechanism according to claim 1, wherein the rotating member comprises a body portion and a connecting portion, the connecting portion is fixedly connected to the body portion, the body portion is provided with a sliding groove, at least a part of the sliding member is accommodated in the sliding groove, and the connecting portion is configured to be rotatably connected to the main shaft assembly.

3. The rotating shaft mechanism according to claim 2, wherein the sliding member comprises a sliding block, and the sliding block is accommodated in the sliding groove and is configured to slide in the sliding groove in the direction toward or away from the main shaft assembly relative to the rotating member.

4. The rotating shaft mechanism according to claim 3, wherein the sliding member further comprises a roller, the roller is rotatably connected to the sliding block via a roller shaft, and the roller abuts against the cam surface.

5. The rotating shaft mechanism according to claim 3, wherein an end portion of the sliding block is further provided with an abutting portion, the abutting portion abuts against the cam surface, and a surface of the abutting portion is an arc surface or a spherical surface.

6. The rotating shaft mechanism according to claim 3, wherein the connecting portion is disposed as an arc shaft, the main shaft assembly is provided with an arc groove, and the arc shaft and the arc groove are configured to slidably cooperate.

7. The rotating shaft mechanism according to claim 3, wherein the rotating member comprises a first rotating arm, a second rotating arm, and a connecting arm, the first rotating arm and the second rotating arm each are rotatably connected to the main shaft assembly, and an end portion of the first rotating arm and an end portion of the second rotating arm that face away from the main shaft assembly are fixedly connected via the connecting arm; and a part of the first rotating arm, a part of the second rotating arm, and a part of the connecting arm that are configured to enclose the sliding groove are configured as the body portion of the rotating member, and an end portion of the first rotating arm and an end portion of the second rotating arm that are configured to be rotatably connected to the main shaft assembly are configured as the connecting portion of the rotating member.

8. The rotating shaft mechanism according to claim 7, wherein the end portion that is of the first rotating arm and that is configured to be rotatably connected to the main shaft assembly is provided with a gear structure, and the end portion that is of the second rotating arm and that is configured to be rotatably connected to the main shaft assembly is provided with a gear structure; and the rotating shaft mechanism comprises another damper assembly such that the rotating shaft mechanism comprises two damper assemblies, the gear structure of a first rotating arm of one damper assembly engages with the gear structure of a first rotating arm or a second rotating arm on a corresponding side of the other damper assembly, and the gear structure of a second rotating arm of one damper assembly engages with the gear structure of a second rotating arm or a first rotating arm on a corresponding side of the other damper assembly.

9. The rotating shaft mechanism according to claim 8, wherein in a length direction of the main shaft assembly, a baffle plate is disposed on each of two sides of the two gear structures that engage with each other, and the baffle plate is configured to limit a center distance between the two gear structures.

10. The rotating shaft mechanism according to claim 3, wherein a first sliding portion and a second sliding portion are respectively disposed on two opposite groove walls of the sliding groove, the sliding block is provided with a third sliding portion and a fourth sliding portion, the third sliding portion is configured to slidably cooperate with the first sliding portion, and the fourth sliding portion is configured to slidably cooperate with the second sliding portion.

11. The rotating shaft mechanism according to claim 3, wherein an elastic element is further disposed in the sliding groove, the sliding block is elastically connected to the elastic element, and the elastic element presses the sliding block toward the cam member.

12. The rotating shaft mechanism according to claim 1, wherein the main shaft assembly comprises a main inner shaft and a main outer shaft, the main inner shaft and the main outer shaft are fastened together to enclose a space, and the cam member and the main inner shaft form an integral structure.

13. A terminal device comprising a flexible display, a first housing, a second housing, and a rotating shaft mechanism, wherein:

the rotating shaft mechanism comprises a main shaft assembly and a damper assembly, and the damper assembly is rotatably connected to the main shaft assembly;

the first housing and the second housing are respectively disposed on two sides of the rotating shaft mechanism, and the first housing and the second housing each are connected to the damper assembly on a corresponding side; and the flexible display continuously covers the first housing, the second housing, and the rotating shaft mechanism, and the flexible display is fixedly connected to the first housing and the second housing;

the damper assembly comprises a cam member and a rotating assembly, the cam member is fixedly fastened on the main shaft assembly, the cam member has a cam surface, the rotating assembly comprises a rotating member and a sliding member, the rotating member is rotatably connected to the main shaft assembly, and the sliding member is configured to slide in a direction toward or away from the main shaft assembly relative to the rotating member; and the sliding member elastically abuts against the cam surface, to generate a damping force between the main shaft assembly and the damper assembly.

14. The terminal device according to claim 13, wherein the rotating member comprises a body portion and a connecting portion, the connecting portion is fixedly connected to the body portion, the body portion is provided with a sliding groove, at least a part of the sliding member is accommodated in the sliding groove, and the connecting portion is configured to be rotatably connected to the main shaft assembly.

15. The terminal device according to claim 14, wherein the sliding member comprises a sliding block, and the sliding block is accommodated in the sliding groove and is configured to slide in the sliding groove in the direction toward or away from the main shaft assembly relative to the rotating member.

16. The terminal device according to claim 15, wherein the sliding member further comprises a roller, the roller is rotatably connected to the sliding block via a roller shaft, and the roller abuts against the cam surface.

17. The terminal device according to claim 15, wherein an end portion of the sliding block is further provided with an abutting portion, the abutting portion abuts against the cam surface, and a surface of the abutting portion is an arc surface or a spherical surface.

18. The terminal device according to claim 15, wherein the connecting portion is disposed as an arc shaft, the main shaft assembly is provided with an arc groove, and the arc shaft and the arc groove are configured to slidably cooperate.

19. The terminal device according to claim 15, wherein the rotating member comprises a first rotating arm, a second rotating arm, and a connecting arm, the first rotating arm and the second rotating arm each are rotatably connected to the main shaft assembly, and an end portion of the first rotating arm and an end portion of the second rotating arm that face away from the main shaft assembly are fixedly connected via the connecting arm; and a part of the first rotating arm, a part of the second rotating arm, and a part of the connecting arm that are configured to enclose the sliding groove are configured as the body portion of the rotating member, and an end portion of the first rotating arm and an end portion of the second rotating arm that are configured to be rotatably connected to the main shaft assembly are configured as the connecting portion of the rotating member.

20. The terminal device according to claim 19, wherein the end portion that is of the first rotating arm and that is configured to be rotatably connected to the main shaft assembly is provided with a gear structure, and the end portion that is of the second rotating arm and that is configured to be rotatably connected to the main shaft assembly is provided with a gear structure; and the rotating shaft mechanism comprises another damper assembly such that the rotating shaft mechanism comprises two damper assemblies, the gear structure of a first rotating arm of one damper assembly engages with the gear structure of a first rotating arm or a second rotating arm on a corresponding side of the other damper assembly, and the gear structure of a second rotating arm of one damper assembly engages with the gear structure of a second rotating arm or a first rotating arm on a corresponding side of the other damper assembly.

* * * * *